(12) United States Patent
Yamazaki et al.

(10) Patent No.: US 7,378,133 B2
(45) Date of Patent: May 27, 2008

(54) FABRICATION SYSTEM, LIGHT-EMITTING DEVICE AND FABRICATING METHOD OF ORGANIC COMPOUND-CONTAINING LAYER

(75) Inventors: Shunpei Yamazaki, Tokyo (JP); Masakazu Murakami, Kanagawa (JP); Hideaki Kuwabara, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/651,286

(22) Filed: Aug. 29, 2003

(65) Prior Publication Data
US 2004/0139914 A1   Jul. 22, 2004

(30) Foreign Application Priority Data
Aug. 30, 2002   (JP) ............................. 2002-255276

(51) Int. Cl.
C23C 16/00    (2006.01)
B05D 3/00    (2006.01)

(52) U.S. Cl. ................ 427/561; 427/248.1; 427/249.1; 118/719; 118/726

(58) Field of Classification Search ............. 427/249.1, 427/255.6, 561; 118/726
See application file for complete search history.

(56) References Cited

U.S. PATENT DOCUMENTS

| | | | |
|---|---|---|---|
| 2,435,997 A | 2/1948 | Bennett | |
| 3,636,305 A * | 1/1972 | Passmore | .................... 392/389 |
| 3,931,490 A | 1/1976 | Grothe et al. | |
| 4,023,523 A * | 5/1977 | Ing ............................. | 118/726 |
| 4,187,801 A | 2/1980 | Monk | |
| 4,627,989 A | 12/1986 | Feuerstein et al. | |
| 4,897,290 A | 1/1990 | Terasaka et al. | |
| 5,258,325 A | 11/1993 | Spitzer et al. | |
| 5,429,884 A | 7/1995 | Namiki et al. | |
| 5,817,366 A | 10/1998 | Arai et al. | |

(Continued)

FOREIGN PATENT DOCUMENTS

EP    1 113 087 A2    7/2001

(Continued)

OTHER PUBLICATIONS

International Search Report Application No. PCT/JP03/11099 Dated Feb. 3, 2004.

(Continued)

Primary Examiner—Karla Moore
(74) Attorney, Agent, or Firm—Nixon Peabody LLP; Jeffrey L. Costellia

(57) ABSTRACT

The present invention provides a vapor deposition system for a film forming systems that promote an efficiency of utilizing an EL material and is excellent in uniformity or throughput of forming an EL layer and a vapor deposition method. According to the present invention, vapor deposition is carried out in a deposition chamber by moving an evaporation source holder 903 on which six containers 911 filled with an evaporation material are set at a certain pitch with respect to the substrate. The evaporation holder 903 is transported from an installation chamber 905 by a transport mechanism 902b. A heater is provided in a turntable 907. Throughput can be improved by heating the evaporation holder 903 in advance of transporting containers into the evaporation holder 903.

18 Claims, 21 Drawing Sheets

U.S. PATENT DOCUMENTS

| | | | |
|---|---|---|---|
| 5,904,961 A * | 5/1999 | Tang et al. | 427/561 |
| 6,132,280 A | 10/2000 | Tanabe et al. | |
| 6,179,923 B1 * | 1/2001 | Yamamoto et al. | 118/719 |
| 6,237,529 B1 | 5/2001 | Spahn | |
| 6,244,212 B1 | 6/2001 | Takacs et al. | |
| 6,296,894 B1 * | 10/2001 | Tanabe et al. | 427/8 |
| 6,326,726 B1 | 12/2001 | Mizutani et al. | |
| 6,337,105 B1 * | 1/2002 | Kunieda et al. | 427/248.1 |
| 6,380,081 B1 * | 4/2002 | Lee | 438/681 |
| 6,403,392 B1 | 6/2002 | Burrows et al. | |
| 6,482,752 B1 | 11/2002 | Yamazaki et al. | |
| 6,660,409 B1 | 12/2003 | Komatsu et al. | |
| 6,696,096 B2 * | 2/2004 | Tsubaki et al. | 427/69 |
| 2001/0006827 A1 | 7/2001 | Yamazaki et al. | |
| 2001/0009154 A1 | 7/2001 | Nguyen et al. | |
| 2002/0009538 A1 | 1/2002 | Arai | |
| 2002/0011205 A1 | 1/2002 | Yamazaki et al. | |
| 2002/0030443 A1 | 3/2002 | Konuma et al. | |
| 2002/0197760 A1 | 12/2002 | Yamazaki et al. | |
| 2003/0015140 A1 * | 1/2003 | Van Slyke et al. | 118/723 VE |
| 2003/0024479 A1 * | 2/2003 | Kashiwaya et al. | 118/726 |
| 2003/0162314 A1 | 8/2003 | Yamazaki et al. | |
| 2003/0180457 A1 | 9/2003 | Murakami et al. | |
| 2003/0194484 A1 | 10/2003 | Yamazaki et al. | |
| 2003/0221620 A1 | 12/2003 | Yamazaki | |
| 2004/0031442 A1 | 2/2004 | Yamazaki et al. | |
| 2004/0035360 A1 | 2/2004 | Yamazaki et al. | |
| 2004/0040504 A1 | 3/2004 | Yamazaki et al. | |
| 2004/0061118 A1 | 4/2004 | Yamazaki et al. | |
| 2004/0139984 A1 | 7/2004 | Yamazaki et al. | |

FOREIGN PATENT DOCUMENTS

| | | |
|---|---|---|
| JP | 60-032361 | 3/1985 |
| JP | 05-304197 | 11/1993 |
| JP | 06-088233 | 3/1994 |
| JP | 07-192866 A | 7/1995 |
| JP | 09-209127 | 8/1997 |
| JP | 10-041069 A | 2/1998 |
| JP | 2000-348859 | 12/2000 |
| JP | 2001-093667 A | 4/2001 |
| JP | 2001-93667 A | 4/2001 |
| JP | 2001-247959 A | 9/2001 |
| JP | 2001-357973 A | 12/2001 |
| JP | 2002-025765 | 1/2002 |
| JP | 2002-33190 A | 1/2002 |
| JP | 2002-060926 | 2/2002 |
| JP | 2002-208480 | 7/2002 |
| JP | 2004-035964 | 2/2004 |
| WO | WO 01/31081 A1 | 5/2001 |

OTHER PUBLICATIONS

PCT/JP-03/11099 Written Opinion dated Jun. 15, 2004.

* cited by examiner tilt regulating screw 302
301
303 heater
300 evaporation source holder container
heater To deposition chamber

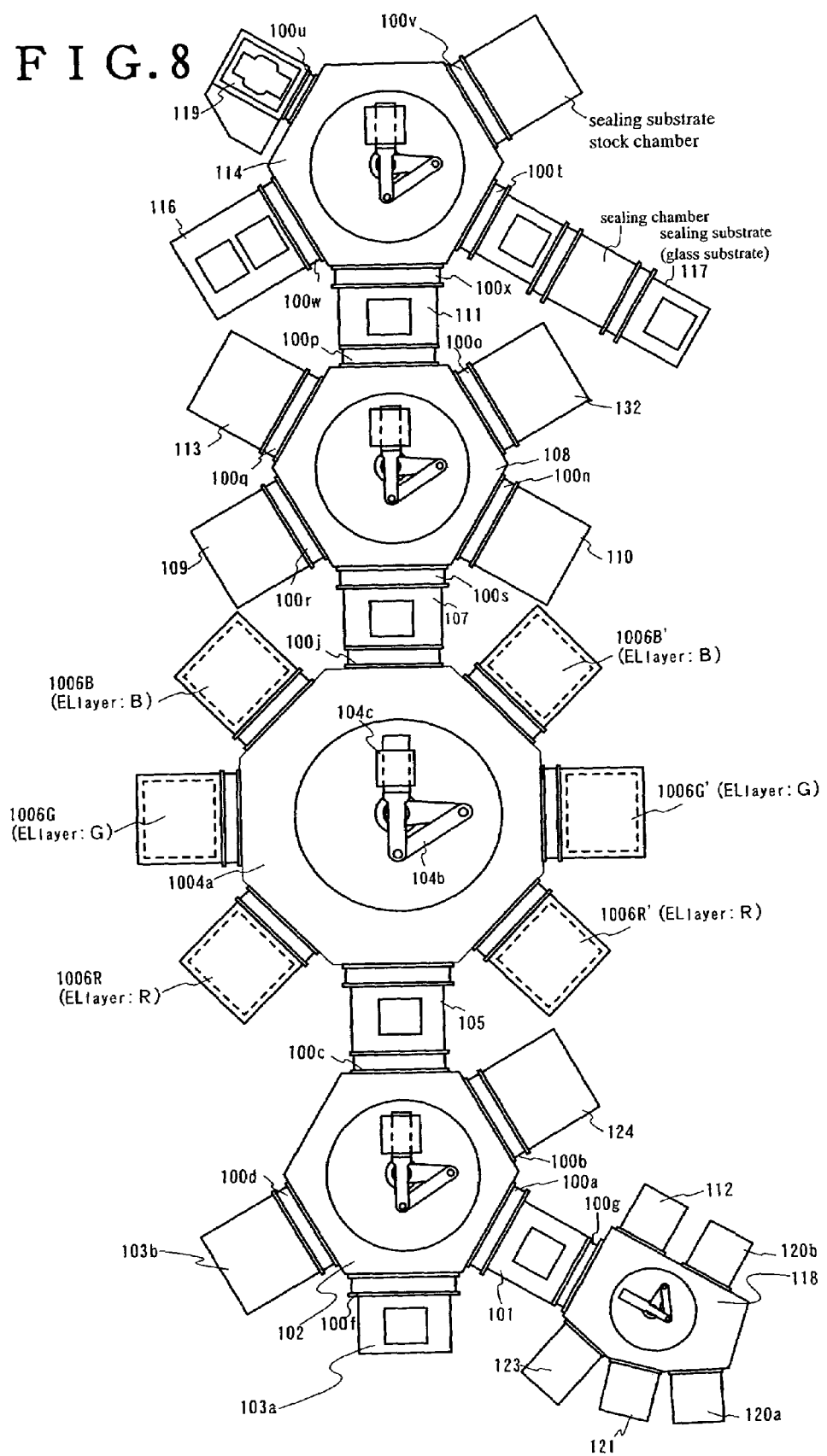

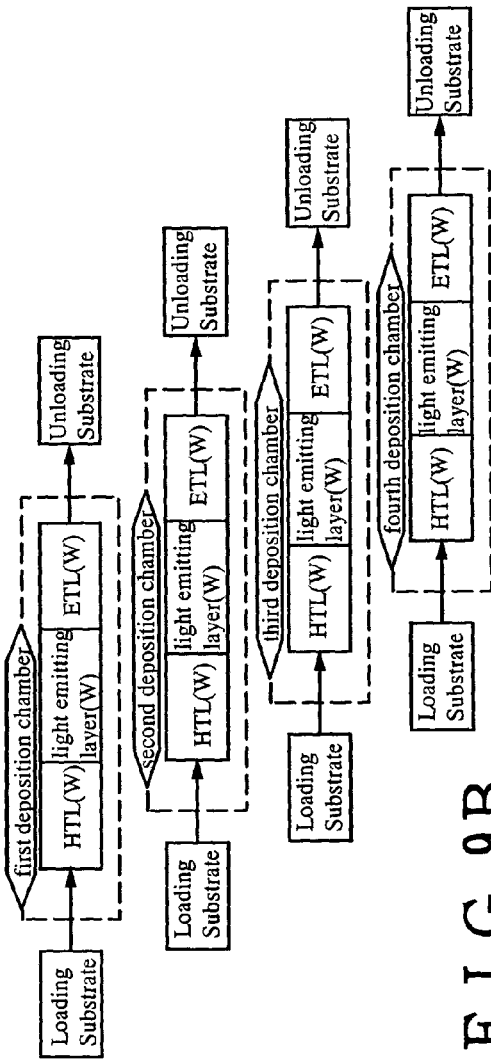
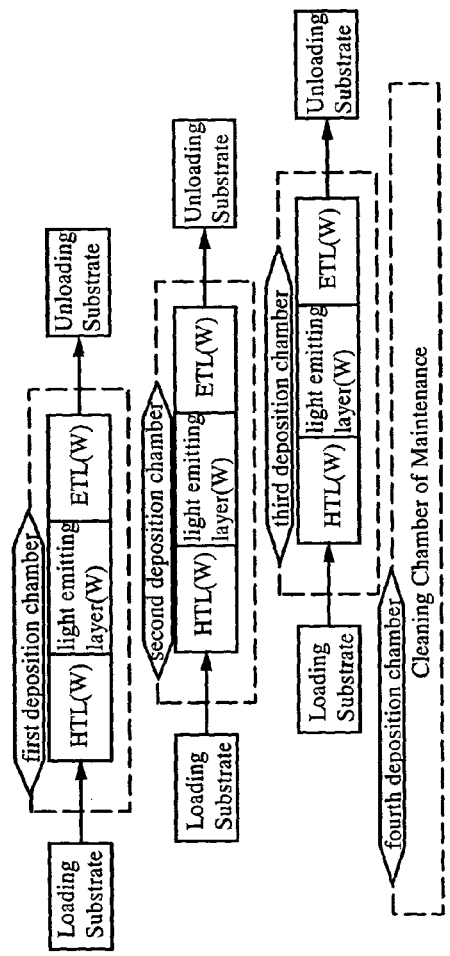
FIG. 9A
FIG. 9B

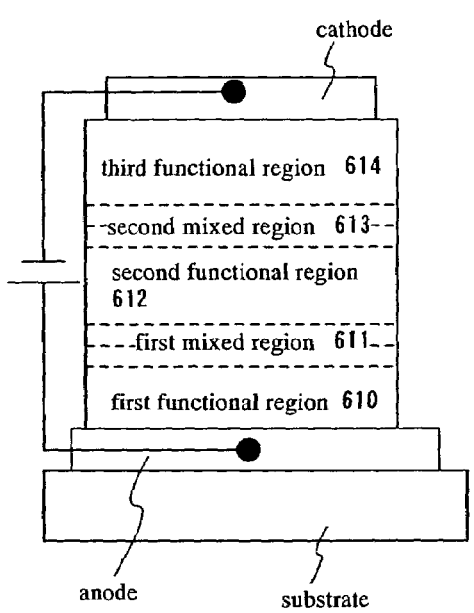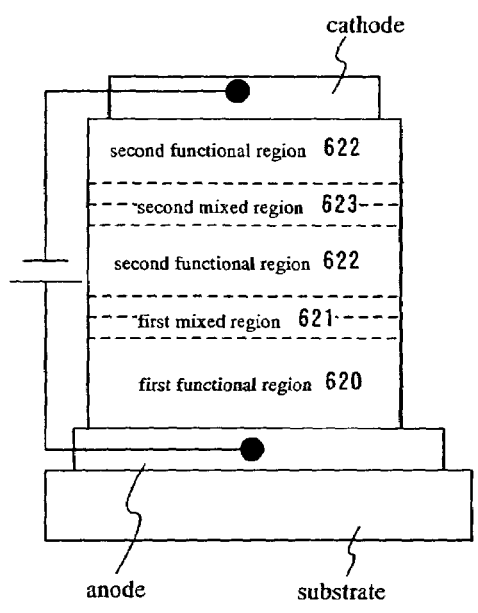
F I G. 14A    F I G. 14B

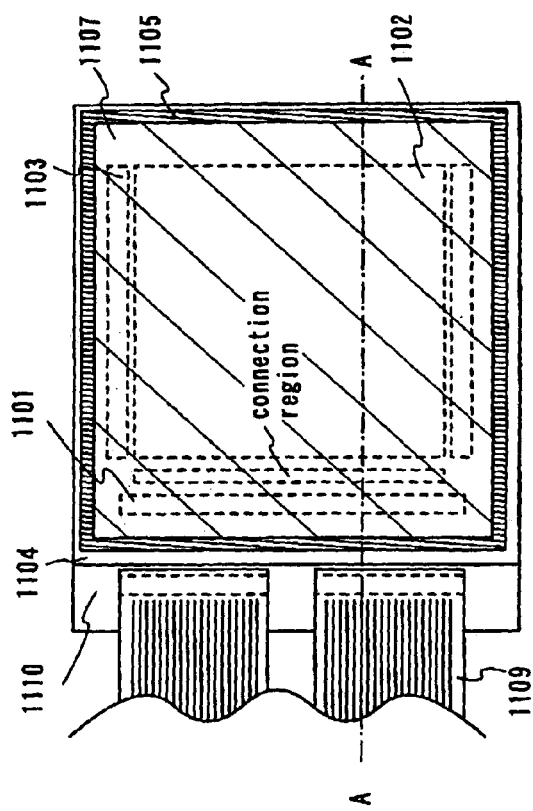
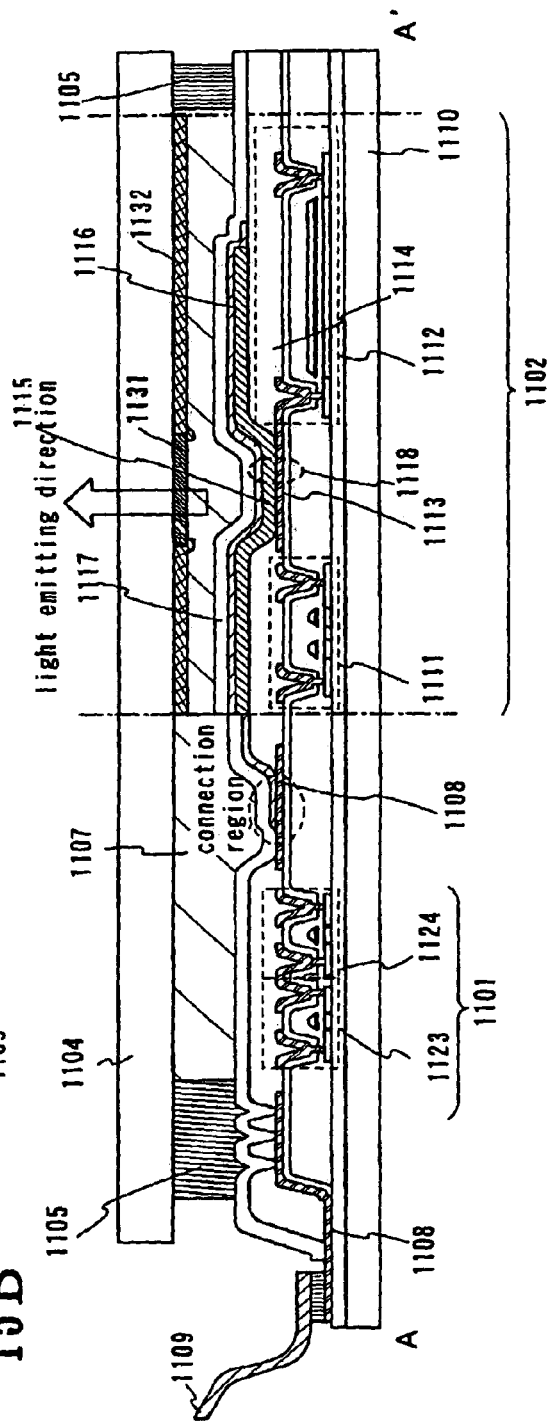
FIG. 15A
FIG. 15B

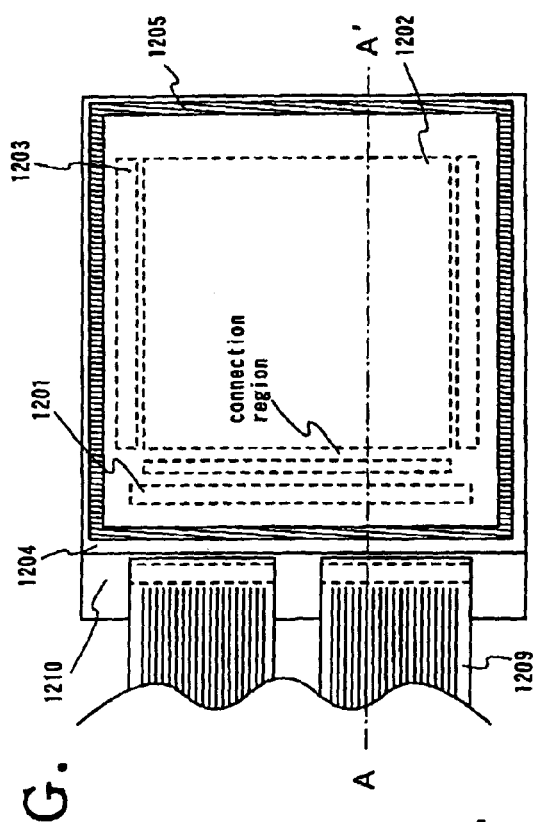
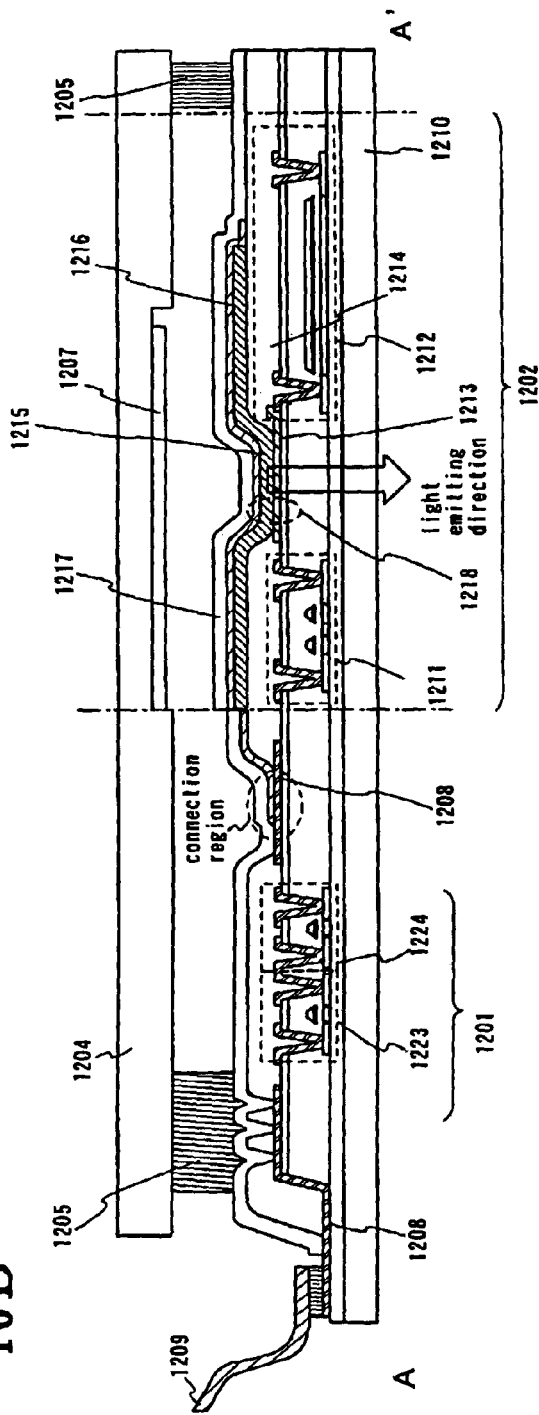
FIG. 16A
FIG. 16B

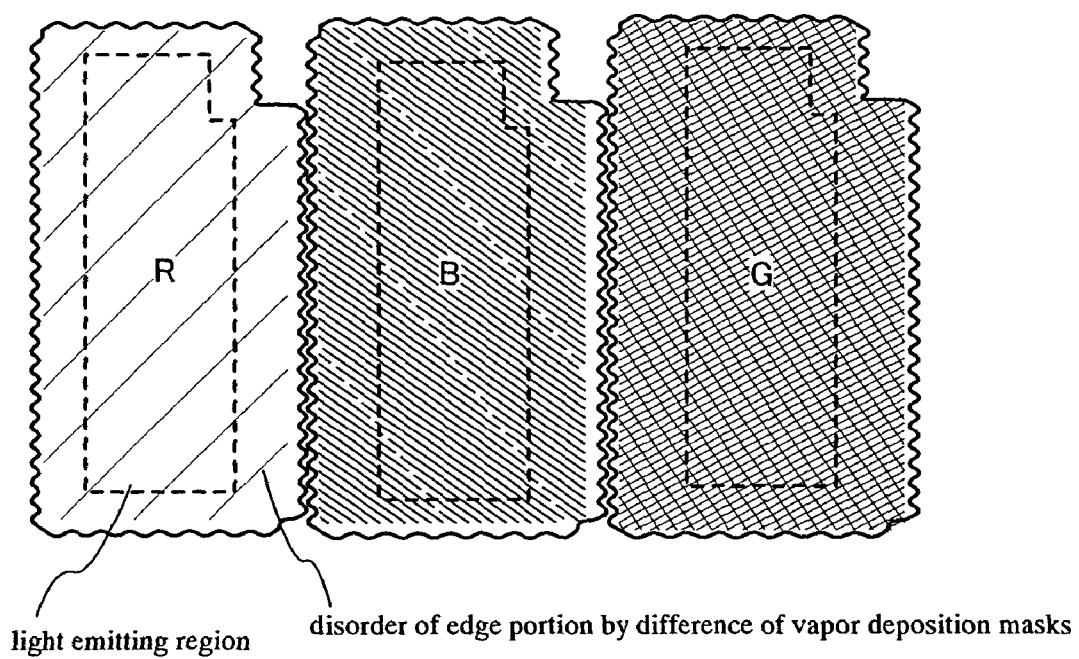
light emitting region | disorder of edge portion by difference of vapor deposition masks
F I G. 21

FABRICATION SYSTEM, LIGHT-EMITTING DEVICE AND FABRICATING METHOD OF ORGANIC COMPOUND-CONTAINING LAYER

BACKGROUND OF THE INVENTION

1. Field of the Invention

The present invention relates to a fabricating system having a film formation system for depositing materials which can be deposited by vapor deposition (hereinafter, an evaporation material), a light-emitting device which has a organic compound containing layer made as a light emitting layer using the fabricating system and a fabricating method thereof. Specifically, the present invention relates to a film formation method (a vapor deposition method) and a fabrication system for forming a film by vaporizing an evaporation material from a plurality of evaporation sources provided to be opposite to a substrate.

2. Description of the Related Art

In recent years, research related to a light-emitting device having an EL device as a self-luminous light emitting device has been activated. The light-emitting device is referred to as organic EL display or organic light-emitting diode. Since these light-emitting devices have characteristics such as rapid response speed that is suitable for moving picture display, low voltage, low power consumption driving, they attracts an attention for a next generation display including new generation's mobile phones and portable information terminals (PDA).

The EL device has an organic compound containing-layer as a light-emitting layer. The EL device has a structure that the organic compound-containing layer (hereinafter, referred to as an EL layer) is sandwiched between an anode and a cathode. Electro luminescence is generated in the EL layer by applying an electric field to the anode and the cathode. Light emission obtained from the EL device includes light emission in returning to a base state from singlet excitation state (fluorescence) and light emission in returning to a base state from triplet excitation state (phosphorescence).

The EL layer has a laminated structure typified "a hole transporting layer, a light-emitting layer and an electron transporting layer." EL material for forming an EL layer is classified broadly into a low-molecular (monomer) material and high-molecular (polymer) material. The low-molecular material is deposited using a vapor deposition system.

The existing vapor deposition system has a substrate holder where a substrate is set, a crucible encapsulating an EL material, in other words an evaporation material, a shutter to prevent the EL material to be sublimed from rising, and a heater for heating an EL material in a crucible. Then, the EL material heated by the heater is sublimed and deposited on a rolling substrate. At this time, in order to deposit uniformly, the distance between the substrate and the crucible needs to be 1 m or more.

According to the above-described vapor deposition system and the above-described vapor deposition method, when an EL layer is formed by vapor deposition, almost all of the sublimated EL material is adhered to an inner wall, a shutter or an adherence preventive shield (a protective plate for preventing a evaporation material from adhering to an inner wall of a deposition chamber) at inside of the deposition chamber of the vapor deposition system. Therefore, in forming the EL layer, an efficiency of utilizing the expensive EL material is extremely low i.e. about 1% or less and fabricating cost of a light-emitting device becomes very high.

Further, according to the vapor deposition system of the related art, in order to provide a uniform film, it is necessary to separate a substrate from an evaporation source by an interval equal to 1 m or more. Therefore, the vapor deposition system per se grows in size, a period required for exhausting each deposition chamber of the vapor deposition system is prolonged and therefore, a film formation speed is slowed down and throughput is lowered. Also, in using a large area substrate, it may be a problem that the film thickness between a center portion and a marginal portion of a substrate is uneven. Further, the vapor deposition system has a structure for a rotation of a substrate and therefore, there is a limit in the vapor deposition system aiming at a large area substrate.

Further, there is a problem that the EL material is easily oxidized and deteriorated due to a presence of oxygen or water. However, in forming a film by a vapor deposition method, a predetermined amount of a evaporation material put into a vessel (glass bottle) is taken out and transferred to a vessel (representatively, crucible, or vapor deposition boat) installed at a position opposite to an object to be deposited at inside of a vapor deposition system and there is a concern that the evaporation material is mixed with oxygen or water or an impurity in the transferring operation.

Further, when the evaporation material is transferred from the glass bottle to the vessel, the evaporation material is transferred by human hands with a glove or the like at inside of a pretreatment chamber of a deposition chamber provided with a glove or the like. However, when the glove is provided at the pretreatment chamber, the chamber cannot be subjected to vacuum, the operation is carried out under atmospheric pressure and there is a high possibility of mixing an impurity. Even when the transferring operation is carried out at inside of the pretreatment chamber subjected to a nitrogen atmosphere, it is difficult to reduce moisture or oxygen as little as possible. Further, although it is conceivable to use a robot, since the evaporation material has a powder-like shape and therefore, it is very difficult to fabricate the robot for carrying out the transferring operation. Therefore, it is difficult to perform steps of forming an EL device, in other words, from a step of forming an EL layer above a lower electrode to a step of forming an upper electrode, by an integrated closed system preventing an impurity from being mixed.

Hence, the present invention provides a vapor deposition system of fabricating systems that promote an efficiency of utilizing an EL material and is excellent in uniformity or throughput of forming an EL layer and a vapor deposition method. Further, the present invention provides a light-emitting device fabricated by the vapor deposition system and the vapor deposition method according to the present invention and a method of fabricating the light-emitting device.

Further, the present invention provides a fabricating system for vapor-depositing an EL material efficiently to a large area substrate having a size of, for example, 320 mm×400 mm, 370 mm×470 mm, 550 mm×650 mm, 600 mm×720 mm, 680 mm×880 mm, 1000 mm×1200 mm, 1100 mm×1250 mm or 1150 mm×1300 mm. Also, the present invention provides a vapor deposition system that makes a whole surface of a large area substrate uniform with even thickness.

SUMMARY OF THE INVENTION

Further, the present invention provides a fabricating system capable of preventing an impurity from being mixed into an EL material.

In view of the foregoing, it is an object of the present invention to provide a vapor deposition system wherein a substrate and an evaporation source are caused relative movement. In particular, it is an object of the present invention to provide a vapor deposition system wherein an evaporation source holder on which a container that is filled with an evaporation material is set moves at a certain pitch with respect to the substrate in a deposition chamber. In this specification, a fabrication system that includes a vapor deposition system having a moving evaporation holder is referred to as a moving cell cluster method.

In addition, one evaporation holder can hold four or more pieces of crucibles, preferably, six or eight pieces of crucibles. According to this, it is not always required that one type of organic material is held in an evaporation holder, plural types of an organic compound can be held therein. Different types of organic compound can be continuously deposited in one chamber according to the following procedure; a hole transporting organic material is filled in a crucible A, a light emitting organic material is filled in a crucible B, an electron transporting organic material is filled in a crucible C, and a cathode buffer material is filled in a crucible D. Further, even if many crucibles cannot be held in an evaporation holder, these types of organic compound can be continuously deposited in one chamber by exchanging sequentially the crucibles by means of making an installation chamber be capable of setting many crucibles therein.

Low deposition rate materials can be deposited in short time with high throughput by means of filling same materials in plural crucibles and depositing them simultaneously. In case of a material that is changed in a film quality depending on the deposition rate is deposited, uniform film quality and thickness can be obtained by filling same materials in plural crucibles and depositing them simultaneously. Further, a region where evaporation materials are mixed (mixed region) on an interface between each film of an EL layer having laminated structure can be formed by filling same materials in plural crucibles and depositing them simultaneously.

If a full color light emitting apparatus is fabricated, for example, it is preferable that a hole injection layer, a hole transporting layer, a light emitting layer, and an electron transporting layer for R are selectively stacked using a deposition mask for R in a first chamber; a hole injection layer, a hole transporting layer, a light emitting layer, and an electron transporting layer for G are selectively stacked using a deposition mask for G in a second chamber; and a hole injection layer, a hole transporting layer, a light emitting layer, and an electron transporting layer for B are selectively stacked using a deposition mask for B in a third chamber. Since an optimum film thickness of each a hole injection layer, a hole transporting layer, a light emitting layer, and an electron transporting layer is different depending on luminous color (R, G, B) of a light emitting device, the respective layer is preferable to be stacked sequentially.

Further, in addition to one type of material provided as a light emitting organic compound in an evaporation source holder, a different organic compound capable of serving as a dopant (dopant material) may also be provided together. It is preferable that an organic compound layer be formed by vapor deposition of a host material and a light emitting material (dopant material) having lower excitation energy than that of the host material. It is also preferable that the excitation energy of the dopant be lower than that of a hole transporting region and an electron transporting layer. The dopant can thus be made to effectively emit light while diffusion of the molecular excitons of the dopant is prevented. Further, the carrier recombination efficiency can also be increased, provided that the dopant is a carrier trapping material. Furthermore, the addition of a material, into a mixed region as a dopant, which is capable of converting triplet excitation energy into luminescence, also falls under the scope of the present invention. A concentration gradient may also be provided in the mixed region.

In addition, in case a plurality of organic compound materials are provided in one evaporation source holder, it is preferable that evaporation directions of the organic compound materials be tilted so as to be crossed at a substrate and be mixed each other. Evaporation directions may be set by tilting a container (crucible) using a tilt regulating screw. Further, four types of evaporation materials (for example, two types of host materials as an evaporation material a, two types of dopant material as an evaporation material b) may be provided in one evaporation source holder.

In an evaporation source holder, a mechanism (typically two-axis stage) which can move into X direction or Y direction with keeping in a horizontal position is provided in a deposition chamber. Here, an evaporation source holder is moved in zigzag on a two-dimensional surface. A moving pitch of an evaporation source holder may be appropriately accommodated to intervals between banks. A film thickness monitor is moved integrated with the evaporation source holder. The film thickness is uniformed by regulating a moving speed of an evaporation source holder according to the measured value by a film thickness monitor.

For example, an evaporation holder may be moved in the range of 30 cm/minute to 300 cm/minute into X direction or Y direction.

In the vapor deposition system according to the present invention, an interval distance d between the substrates and the evaporation source holder during evaporation is typically shortened to equal to or less than 30 cm, preferably equal to or less than 20 cm, more preferably from 5 cm to 15 cm. The utilization efficiency of the evaporation material as well as throughput is thus markedly improved.

A deposition mask is likely to be heated since the interval distance d between a substrate and an evaporation holder is shortened typically not more than 30 cm. Therefore, it is preferable that the deposition mask is made from a metal material having low coefficient of thermal expansion, for example, high-melting point metals such as tungsten, tantalum, chrome, nickel, molybdenum, or an alloy containing these elements such as stainless, Inconel, Hastelloy. In addition to these materials, low coefficient of thermal expansion alloys containing nickel 42% and iron 58% can also be used. For cooling the heated deposition mask, a mechanism for circulating a cooling medium, for example, cooling water, cooling gas, or the like, can be provided to the deposition mask. Since a deposition mask is moved according to the present invention, it is possible that inferior deposition caused by deformation of masks due to heat can be minimized if the moving speed of the deposition mask is high.

It is preferable that deposits attached to a mask is vaporized to be exhausted to outside of a deposition chamber for cleaning the deposits attached to the mask by generating plasma in the deposition chamber by a plasma generator. Therefore a deposition chamber has a gas introducer for introducing one or plural types of gas selected from Ar, H, F, NF$_3$, or O, and an exhauster for exhausting vaporized deposits. In addition, a power source is put to a mask separately, and a high frequency power source is connected to either thereof. According to this, the mask is preferable to be made from a conductive material. For example, a mask can be cleaned without being damaged by generating plasma between a substrate shutter used as an electrode and the mask under the condition that a gas flow rate of 30 sccm, H$_2$ gas of 30 sccm, and RF power of 800W. A deposition chamber can be cleaned without exposing to the air when maintenance is conducted by adopting above described structure. It is preferable that both a cleaning means for cleaning only a mask simply and a plasma cleaning means for cleaning strongly whole chamber are equipped with the deposition chamber.

In above described vapor deposition system, an evaporation source holder comprises: a container (typically a crucible); a heater set outside of the container via a soaking member; a heat insulating layer set outside of the heater; an outer casing storing these; a cooling pipe rounded around the outside of the outer casing; an evaporation shutter that opens and closes an opening portion of the outer casing including an opening portion of a crucible; and a film thickness sensor. In addition, a container in which a heater locked in capable of being transferred may be used. The container is formed of a material such as heat-resisting metal (Ti) sintered boron nitride (BN), a sintered compound of boron nitride (BN) and aluminum nitride (AlN), quartz, or graphite so as to be capable of withstanding high temperature, high pressure, and low pressure.

A fabrication system according to the present invention has the configuration: comprising: a load chamber, a transport chamber coupled with the load chamber, plural deposition chambers coupled with the transport chamber, and an installation chamber coupled with each of the plural deposition chambers, wherein each of the plural deposition chambers is coupled with a first vacuum exhaust treatment chamber for evacuating inside of each of the plural deposition chambers, wherein each of the plural deposition chambers comprises: an alignment means (a CCD camera and a stopper) performing a positional alignment between a mask and a substrate, a substrate holding means (a frame), and means (a stage) for moving an evaporation source holder, the evaporation source holder having at least one container in which an evaporation material has been sealed, means (a heater) for heating the container; and a shutter provided over the container, wherein the installation chamber is coupled with a second vacuum exhaust treatment chamber for evacuating an inside of the installation chamber, wherein the installation chamber comprises: means (a heater) for heating a container, and means (an arm) for carrying the container to the evaporation source holder in the deposition chamber.

A deposition chamber is allowed to have only one evaporation source holder and also plural evaporation source holders.

In accordance with that the substrates and the evaporation source holders are caused relative movement to each other, it is not necessary to increase the distance between a substrate and an evaporation source holder, and apparatus miniaturization can thus be achieved. Further, the vapor deposition system is miniaturized, therefore the adhesion of sublimated evaporation materials on interior walls in the deposition chambers or on evaporation preventing shields can be reduced. The evaporation materials can thus be utilized without waste. In addition, it is not necessary to rotate the substrates by deposition according to the present invention, therefore a vapor deposition system capable of handling large area substrates can be provided. Further, it becomes possible to form vapor deposited films uniformly in accordance with that the evaporation source holders are moved with respect to the substrates in X-direction and in Y-direction. Since a deposition mask is moved according to the present invention, it is possible that inferior deposition caused deformation of masks due to heat can be minimized.

As shown in FIG. 3A and FIG. 3B, the vapor deposition can be controlled without using a shutter by floating a container from a heater. Specifically, the container is cooled by floating for separating from the heater using a lifting pin made of quartz, ceramic, or the like. In the event that the container is cooled by floating using the lifting pin, it is preferable that the container is made of a metal material with heat dissipation characteristics and is formed to have a thin wall. In addition, FIG. 3A is a cross-sectional diagram showing two cells in which one of them carries out vapor deposition. FIG. 3B shows the state that both cells carry out vapor deposition.

A fabrication system according to the present invention has the configuration: a load chamber, a carrier chamber coupled with the load chamber, plural deposition chambers coupled with the carrier chamber, and an installation chamber coupled with each of the deposition chambers, wherein each of the plural deposition chambers is coupled with a first vacuum exhaust treatment chamber for evacuating inside of each of the deposition chambers; and wherein each of the plural deposition chambers comprises: an alignment means (a CCD camera and a stopper) performing a positional alignment between a mask and a substrate, a substrate holding means (a frame), and means (a stage) for moving an evaporation source holder, the evaporation source holder having at least one container in which an evaporation material has been sealed, means (a heater) for heating the container; and means (a lifting pin) for cooling the container by floating the container from the evaporation source holder, and wherein the installation chamber is coupled with a second vacuum exhaust treatment chamber for evacuating an inside of the installation chamber; and wherein the installation chamber comprises: means (a heater) for heating a container, and means (an arm) for carrying the container to the evaporation source holder in the deposition chamber.

Since penetrating trace amount of moisture including absorption moisture to an organic compound is the main cause of the shrink that causes non light emitting regions, moisture (including absorption moisture) in an active matrix substrate is preferable to be removed just before forming a layer containing an organic compound on the active matrix substrate with TFT.

Preventing or decreasing the generation of shrink is possible by heating uniformly plural substrates using a flat sheet heater (typically, a sheath heater) in a heating chamber and by carrying out vacuum heating on the heated substrates in the range of 100 to 250° C. before forming a layer containing an organic compound. Specifically, in case an organic resin film is used for a material of an interlayer insulating film or a bank, the problems will be occurred that some organic materials are easily damaged by absorption moisture and degasification generates potentially. Hence it is beneficial for preventing or decreasing the generation of shrink by carrying out a vacuum heating in the range of 100 to 250° C. before forming a layer containing an organic compound.

In the above described each configuration of a fabrication system, the above described transport chamber in which a plurality of flat sheet heaters are set to be overlapped and to have uniform intervals is connected to a treatment chamber in which a vacuum heating can be conducted on a plurality of substrates. Preventing or decreasing the generation of shrink is possible by conducting uniformly a vacuum heating on substrates to remove moisture on the substrates.

Further, in the above described each configuration of a fabrication system, a means of moving the above described evaporation source holder has a function for moving the above described evaporation source holder in an X-direction at a certain pitch and in a Y-direction at a certain pitch. It is unnecessary to rotate a substrate in the vapor deposition method according to the present invention, consequently, a vapor deposition system available for vapor deposition of a large substrate. In addition, an evaporation material can be deposited uniformly by means of moving an evaporation source holder in an X-direction or Y-direction.

For forming a uniform thickness, it is preferable to rotate an evaporation holder at the periphery portion of a substrate. Further, it is preferable to move the evaporation holder at a certain pitch for a vaporized evaporation material to be overlapped at the bottom.

The process of setting an EL material in a deposition chamber before carrying out vapor deposition or the process of vapor deposition may be considered as the process that allows potentially impurities such as oxygen or moisture to penetrate into the EL material or a metal material that will be vapor deposited.

Generally, a container for preserving an EL material is a brown-capped glass bottle using a plastic cap. It can be thought that the bottle is not properly capped.

Conventionally, an evaporation material is displaced from the container (the glass bottle) to another container (typically, a crucible or an evaporation boat) set opposed to a substrate in a vapor deposition system. There is a risk of impurities being mixed into the evaporation materials during the materials are displaced to another container. That is, there is a danger of deterioration of an EL device from oxygen, moisture, or another impurities.

The materials may be, for example, manually transferred from a glass bottle to a container in a pretreatment chamber using gloves, or the like provided in a vapor deposition system. However, if gloves are set in the pretreatment chamber, the chamber cannot be vacuumized. Owing to this, the materials should be transferred to another chamber in an atmospheric pressure. It is difficult to reduce moisture or oxygen as much as possible in the pretreatment chamber even in a nitride atmosphere. Using a robot can be considered, however, it is difficult to manufacture a robot that can treat powdery material. Accordingly, it is difficult to make a fabrication system a continuous closed system capable of preventing impurities being mixed into EL materials, in which complete automation is made from the step of forming an EL layer on a lower portion electrode to the step of forming an upper portion electrode.

In accordance with the foregoing, the present invention provides a fabrication system, wherein an EL material or metal material is directly stored and hermetically sealed in the container that will set in a vapor depositing system without using the brown bottle glass typically or the like used conventionally and carries out vapor deposition after transporting the materials, to prevent impurities from being mixed into high purity evaporation materials. For storing directly EL evaporation materials into a container, sublimation purification of the EL evaporation materials may be conducted directly to a container (crucible), which will be set in a vapor deposition system, without dividing obtained EL materials into separate containers. According to the present invention, superpurification of evaporation materials can be possible in future. In addition, a metal material can be stored directly into a container, which will be set in a vapor deposition system to be vapor deposited by resistance heating.

The form of the container will be described with reference to FIG. 4A. A second container has two portions of an upper portion (721*a*) used for transporting and a lower portion (721*b*) and comprises a fixator 706 for fixing a first container on top of the second container; a spring 705 for applying pressure to the fixator; a gas introduction port 708 at the lower portion of the second container, which serves as a gas pathway for maintaining a reduced pressure in the second container; an O-ring that fixes the upper portion container 721*a* and the lower portion container 721*b*; and a fastener 702. A first container 701, in which a purified evaporation material is filled, is set in the second container. In addition, the second container is preferable to be made of a material containing stainless, and the first container is preferable to be made of a material containing titanium.

A purified material is filled in the first container 701 at the material manufacturer. The upper second container 721*a* and the lower second container 721*b* are fitted each other using the O-ring and fixed using the fastener 702. And the first container 701 is hermetically sealed in the second container, then, the second container is reduced pressure and substituted for nitride atmosphere through the gas introduction port 708, and then, the first container 701 is fixed by adjusting the spring 705 with the fixator 706. In addition, a drying agent can be put into the second container. Consequently, forming a vacuum, low pressure, or nitride atmosphere in the second container can prevent even trace amount of oxygen or moisture from adhering to an evaporation material.

The containers in this state are transferred to the light emitting device manufacturer, and the first container 701 is directly transported into a deposition chamber. Thereafter, the evaporation material is sublimated by heat treatment deposited on a substrate.

It is preferable that another parts, for example, a film-thickness monitor (such as a crystal oscillator), shutter, or the like is transported without exposing to the air into a vapor deposition system.

It is preferable that the light emitting device manufacturer asks the material manufacturer that makes or sells an evaporation material to store an evaporation material directly to the container that will be set in the above described vapor deposition system. An attempt of trying to decrease the mixed impurities of the light emitting device manufacturer in collaboration with the material manufacturer can maintain the extremely high purity EL materials obtained by the material manufacturer. And, it is possible to carry out vapor deposition without degrading purity by the light emitting device manufacturer.

Even if high purity EL materials are provided by the material manufacturer, there is a risk of impurities being mixed unless the materials should be displaced to another container at the light emitting device manufacturer. Consequently, the purity of EL materials cannot be kept high, and so there is a limitation of the purity of EL materials.

In view of the foregoing, a crucible (in which an evaporation material is filled) that is sealed with vacuum in a container without exposing to the air is transported from the container into a deposition chamber without exposing to the air to from an installation chamber using a transporting robot. The installation chamber for setting the crucibles in an evaporation source holder is connected to the deposition chamber. It is preferable that a vacuum pumping system and a heater for heating the crucible be equipped with the installation chamber.

A mechanism of setting a first container 911 that is transported into the state of hermetically sealed in the second container 721a and 721b to the deposition chamber will be described with reference to FIG. 4B and FIG. 5A.

FIG. 4A is a top surface view of an installation chamber 905 that comprises a turntable 907 on which a second container 912 storing a first container is placed, a transport mechanism for carrying the first container, and a hauling mechanism (an arm) 902a. It is possible to control the atmosphere of the installation chamber that is adjacent to the deposition chamber through the gas introduction port by using a controller. Note that the transport mechanism according to the present invention is not limited to the structure in which the top portion of the first container is sandwiched (picked up) as shown in FIG. 4B. The structure in which the side portion of the first container 701 is sandwiched (picked up) may also be employed.

The second container is placed on the turntable 713 in the installation chamber in a state where the fastener 702 is released. Since the in side of the installation chamber is vacuumized, the fastener 702 is not necessary. The inside of the installation chamber is then reduced the pressure by an atmospheric controller. The second container can be easily opened when the pressure within the installation chamber becomes equal to the pressure within the second container. The upper portion 721a of the second container is then removed by using the hauling mechanism 711, and the lower second container and the first container 701 is moved by rotating the turntable 713 with a rotation axis 712. Then, the first container 701 is transported into the deposition chamber using a transport mechanism and set in an evaporation holder (not shown).

Thereafter, the evaporation material is sublimated by a heater equipped with the evaporation source holder 803 and started to be deposited. When a shutter (not shown) installed with the evaporation source holder is opened, the sublimated evaporation material will scatter toward the substrate and deposit thereon, thus form a light emitting layer (including a hole transporting layer, a hole injecting layer, an electron transporting layer, and an electron injecting layer).

The first container 701 is removed from the evaporation source holder after the vapor deposition is completed, and transported into an the installation chamber to be placed on a second lower container (not shown), which is disposed on the turntable 907, and then, hermetically sealed by the upper container 721a. Here, it is preferable that the first container, the upper container 721a, and the lower container be sealed together in the second container in this transported combination. In this state, inside the installation chamber 905 is formed the atmospheric pressure and the second container is transferred from the installation chamber with being fixed by the fastener 702 to the material manufacturer.

An example of an installation chamber capable of having a plurality of first containers 911 is shown in FIG. 5A and FIG. 5B. As shown in FIG. 5A, an installation chamber 905 comprises a turntable 907 that can be placed a plurality of first containers 911 or second containers thereon, a transport mechanism 902b for transporting the first container, and a hauling mechanism 902a. A deposition chamber 906 comprises an evaporation source holder 903 and a moving mechanism (not shown here) for moving the evaporation source holder. FIG. 5A shows a top view of the installation chamber, and FIG. 5B shows a perspective view of the inside of the installation chamber. In addition, the installation chamber 905 is placed to adjacent be to the deposition chamber 906 via a gate valve 900, and possible to control the atmosphere in the installation chamber by an atmospheric controller through a gas introduction port. Although not shown in the figures, the place where a removed upper portion (the second container) 912 is set is provided separately.

Alternatively, a robot is installed in the pretreatment chamber (installation chamber) coupled with the deposition chamber, and an evaporation material can be moved with an evaporation source to the pretreatment chamber and set in an evaporation source therein. Therefore a fabrication system that has a configuration in which an evaporation source moves to a pretreatment chamber may be formed. Accordingly, an evaporation source may set with keeping a deposition chamber cleanly.

Further, the present invention may reduce the processing time per single substrate. As shown in FIG. 8, a multichamber fabrication system has a plurality of deposition chambers comprising a first deposition chamber for depositing onto a first substrate, and a second deposition chamber for depositing onto a second substrate. A plurality of organic compound layers are laminated concurrently in each of the deposition chamber, thus the processing time per single substrate is reduced. That is, the first substrate is taken out from a transport chamber and placed in the first deposition chamber, and vapor deposition on the first substrate is carried out. During this time, the second substrate is taken out from the transport chamber and placed in the second deposition chamber, and vapor deposition is also carried out on the second substrate.

Six deposition chambers are provided with a transport chamber 1004a as shown in FIG. 8, and it is therefore possible to place six substrates into the respective deposition chambers and carry out vapor deposition in order and concurrently. Further, vapor deposition can also be carried out during maintenance of one deposition chamber by using the other deposition chambers, without temporarily stopping the production line.

An example of the procedure of vapor deposition for forming a layer containing an organic compound according to the present invention is described in the following: Firstly, a container in which a crucible is sealed with vacuum, and, the inside of an installation chamber is evacuated, then, the crucible is removed from the container. Secondly, the crucible is heated up to temperature T, however, it is necessary to be careful not to start vapor deposition in the installation chamber by controlling the degree of vacuum in the installation chamber to be lower than that during an vapor deposition. Thirdly, the heated crucible is transported from the installation chamber into the deposition chamber. The crucible is set in an evaporation holder heated in advance in the deposition chamber, and the degree of vacuum inside of the deposition chamber is increased, then, vapor deposition is started. The evaporation source holder can be moved in X-direction or Y-direction, and so the fixed substrate can be deposited uniformly. Heating the crucible in advance can reduce the heating time.

A method of forming a layer containing an organic compound according to the present invention has the configuration: installing a container in which a material containing the organic compound has been filled to an installation chamber; vacuum-exhausting the installation chamber; heating the container to a temperature T in the installation chamber; carrying the heated container to an evaporation holder previously heated to the temperature T; transporting a substrate into a deposition chamber; carrying out vapor deposition to the substrate by making a degree of vacuum in the deposition chamber higher than that in the installation chamber while maintaining the container to the temperature T; and carrying the substrate.

In the present invention, it is preferable that the process through the fabrication process to the sealing of a layer containing an organic compound is conducted without exposing to the air for preventing moisture from penetrating into a layer containing an organic compound.

Further, when each light emitting layer of R, G, B is fabricated using above described vapor deposition system, if any layer of a hole injecting layer, a hole transporting layer, a light emitting layer, an electron transporting layer is formed using a different mask, the light emitting layer will be rough around its edge portion as shown in FIG. 21 and the resistance value thereof will be varied. Although the edge portion is not to be a light emitting region, it causes increasing the drive voltage of a light emitting device or short-circuiting in a portion adjacent to a pixel layer. According to the present invention, an interval of a substrate and an evaporation source is reduced to be not more than 20 cm, preferably, in the range of 5 cm to 15 cm, and an edge portion can be flushed with each other, moreover, the light emitting device can be separated from the adjacent pixels because a hole injection layer, a hole transporting layer, a light emitting layer, and an electron transporting layer are deposited using same mask.

A light emitting device fabricated by the above described fabrication system is one aspect of the present invention. A light emitting device according to present has a structure that comprises a cathode on a substrate having an insulating surface; a lamination layer containing an organic compound in contact with the cathode; and an anode in contact with the lamination layer containing the organic compound. The lamination layer containing an organic compound is flushed at the end portions of at least two layers. The light emitting device is covered by a lamination layer comprising a first inorganic insulating film, a film having hygroscopicity and transparency, and a second inorganic insulating film.

Besides, a light emitting device according to present invention has another structure that comprises a cathode on a substrate having an insulating surface; a lamination layer containing an organic compound in contact with the cathode; and an anode in contact with the lamination layer containing the organic compound. An upper layer of a lamination layer containing an organic compound is formed to overlap with a lower layer of the lamination layer containing an organic compound. The light emitting device is covered by a lamination layer comprising a first inorganic insulating film, a film having hygroscopicity and a transparency, and a second inorganic insulating film.

In each above described structure, the film having hygroscopicity and a transparency has smaller stress than the first inorganic insulating film and the second inorganic insulating film, and has an influence on relaxing the stress of the first inorganic insulating film and the second inorganic insulating film.

In addition, in each above described structure, the first inorganic insulating film or the second inorganic insulating film is formed of a silicon nitride film, a silicon oxide film, a silicon oxynitride film, a DLC film, a CN film formed with sputtering or CVD, or a lamination layer of these films. Preferably, the first inorganic insulating film or the second inorganic insulating film is formed of a silicon nitride film deposited with high frequency sputtering using silicon as a target.

The fine silicon nitride film deposited with RF sputtering using silicon target prevents effectively the fluctuation of the threshold voltage due to the contamination of TFT from alkaline metal or alkaline earth metal such as natrium, lithium, magnesium, and has a high blocking efficiency against moisture or oxygen. In addition, it is preferable that the oxygen content and hydrogen content is not more than 10 atom %, more preferably, not more than 1 atom % for increasing the blocking efficiency.

The specific sputtering condition is as follows: nitride gas or mixed gas of nitride and rare gas are used, pressures of 0.1 to 1.5 Pa, frequencies of 13 MHz to 40 MHz, electric energies from 5 to 20 W/cm$^2$, substrate temperatures from room temperature to 350° C., distances between a silicon target (1 to 10 Wcm) and a substrate from 40 mm to 200 mm, and back pressures not more than $1 \times 10^{-3}$ Pa. Rare gas may be sprayed in the back surface of a substrate. For example, the fine silicon nitride film, which is formed in the condition, for example, flow ratio is set as Ar: N$_2$=20 sccm: 20 sccm, a pressure of 0.8 Pa, a frequency of 13.56 MHz, an electric energy of 16.5 W/cm$^2$, a substrate temperature of 200° C., a distance between a substrate and a silicon target of 60 mm, back pressures of $1 \times 10^{-5}$ Pa, has a characteristics of having low etching speed (etching speed when etching at 20° C. using LAL500; hereafter the same), of not more than 9 nm (preferably, not more than 0.5 to 3.5 nm), and a low hydrogen concentration of not more than $1 \times 10^{21}$ atoms/cm$^{-3}$ (preferably, not more than $5 \times 10^{20}$ atoms/cm$^{-3}$). Note that the term "LAL500" denotes the product "LAL 500 SA buffered hydrofluoric acid" manufactured by Hashimoto Chemical KK, and is an aqueous solution of NH$_4$HF$_2$ (7.13%) and NH$_4$F (15.4%).

A silicon nitride film deposited by sputtering has following characteristics, a dielectric constant of 7.02 to 9.3, refractive index of 1.91 to 2.13, an internal stress of 4.17 to $10^8$ dyn/cm$^2$, and an etching rate of 0.77 to 1.31 nm/min. Which unit of plus sign or minus sign of the internal stress is used is depending on which internal stress of a compressive stress or a tensile stress is referred to. Only an absolute value is referred to here. The silicon nitride film deposited by sputtering has a Si concentration of 37.3 atomic % and an N concentration of 55.9 atomic % that are obtained from the result of RBS. The silicon nitride film deposited by sputtering has a hydrogen concentration of $4 \times 10^{20}$ atoms/cm$^{-3}$, an oxygen concentration of $8 \times 10^{20}$ atoms/cm$^{-3}$, and a carbon concentration of $1 \times 10^{19}$ atoms/cm$^{-3}$. The silicon nitride film deposited by sputtering has transmittance of more than 80%.

In each above described structure, a thin film containing above described carbon as its main component is a diamond like carbon film (also referred to as DLC film), a CN film, or an amorphous carbon film with 3-10 nm thickness. The DLC film has a SP$^3$ bond as a carbon-carbon bond in a short range order, however, an amorphous structure at the macro level. A constitution of the DLC film is carbon of 70 to 95 atomic % and hydrogen of 5 to 30 atomic %. The DLC film is extremely solid and has high insulation performance. In addition, the DLC film is chemically stable and hard to change. The DLC film has a thermal conductivity of 200 to 600 W/mk enabling dissipating exothermic heat during driving. Such DLC film has a characteristic of having low gas permeability such as moisture or oxygen. In addition, it is known that the DLC film has a degree of hardness of 15 to 25 Gpa by a microhardness tester.

The DLC film can be deposited by a plasma CVD (typically, an RF plasma CVD, a micro wave CVD, an electron cyclotron resonance (ECR) CVD, a hot-filament CVD), a combustion-flame, a sputtering, an ion beam deposition, a laser deposition, or the like. Whichever deposition method is used, the DLC film can be formed with a good adhesiveness. The DLC film is formed by placing a substrate on a cathode. The DLC film can be formed to be fine and hard by applying a negative bias and utilizing ion bombardment to some extent.

Reactive gases to be used for the film formation are a hydrogen gas and a hydrocarbon gas (e.g., $CH_4$, $C_2H_2$, and $C_6H_6$). The DLC film is formed by ionizing the reactive gas with glow discharge and bombarding ions on the cathode being subjected to negative self-bias. Consequently, a fine and smooth DLC film can be obtained. Furthermore, the DLC film is an insulating film which is transparent or translucent to visible light. In this specification, the term "transparent to visible light" means a transmittance of 80 to 100% for visible light, and the term "translucent to visible light" means a transmittance of 50 to 80% for visible light.

The reaction gas for depositing a CN film may be nitride gas and a hydrocarbon gas (e.g., $C_2H_2$ and $C_4H_4$).

In each above described structure, the above described film that has hygroscopicity and transparency is a material film formed by vapor deposition. For example, an alloy film of MgO, $SrO_2$, SrO, $CaF_2$, CaN, or a material film containing an organic compound such as a-NPD (4,4'-bis[N-(1-naphthyl)-N-phenyl-amino]-biphenyl), BCP (bathocuproin), MTDATA (4,4',4"-tris[N-(3-methylphenyl)-N-phenyl-amino]-triphenylamine), $Alq_3$ (tris(8-quinolinolato)aluminum may be used. Therefore, some of the film that has hygroscopicity and transparency is made from the same material of at least one layer among a lamination layer comprising layers containing organic compounds sandwiched between the cathode and the anode.

The film that has hygroscopicity and transparency may be a polymer material film containing an organic compound formed by coating (such as ink-jet, spin-coating, or the like), for example, polyaniline, polythiophene derivative (PEDOT), or the like.

The present invention is not limited to the lamination layer structure having the structure: "a cathode, a first inorganic insulating film, a film having hygroscopicity and transparency, a second inorganic insulating film". For example, the lamination layer may also have the structure: "a cathode, a film having hygroscopicity and transparency, a first inorganic insulating film, a film having hygroscopicity and transparency, a second inorganic insulating film" or a multilayer structure: "a cathode, a first inorganic insulating film, a film having hygroscopicity and transparency, a second inorganic insulating film, a film having hygroscopicity and transparency, a third inorganic insulating film".

In addition, in each above described structure, in case that the light emitting device is formed as an active matrix type, a light emitting device and a TFT connected to the light emitting device are formed on the first substrate.

In the above description, a lamination layer of "a hole transporting layer, a light emitting layer, an electron transporting layer" as an typical example of the structure of a layer containing an organic compound between a cathode and an anode, but it is not limited to the structure. A lamination layer structure of "an anode, a hole injecting layer, a hole transporting layer, a light emitting layer, an electron transporting layer" or "an anode, a hole injecting layer, a hole transporting layer, a light emitting layer, an electron transporting layer, an electron injecting layer", two-layer structure, or a single-layer structure may also be employed. For a light emitting layer, a light emitting layer having a hole transportation property or a light emitting layer having an electron transporting property can be used.

These all layers can be fabricated using a material of low molecular system, or one layer or some layer thereof can be fabricated using a material of polymer system. In this specification, all-layers sandwiched between a cathode and an anode is referred to as a layer containing an organic compound (EL layer) as a generic term. Therefore, above described layers, a hole injecting layer, a hole transporting layer, a light emitting layer, an electron transporting layer, an electron injecting layer are all included as an EL layer. Further, a layer containing an organic compound (EL layer) can be contained an inorganic material such as silicon.

A light emitting device (EL device) comprises a layer containing an organic compound (hereinafter, an EL layer) that generates electroluminescence by applying an electric field, an anode, and a cathode. Luminescence generated in an organic compound includes light emission in returning to a base state from singlet excitation (fluorescence) and light emission in returning to a base state from triplet excitation (phosphorescence). The light emitting device according to the present invention can be applied to either case of utilizing fluorescence or phosphorescence.

In the light emitting device according to the present invention, the drive method for screen display is not especially limited. For example, a dot-sequential drive method, a line-sequential drive method, or a plane-sequential drive method can be used for the drive method in the present invention. In addition, a video signal for inputting into a source line of the light emitting device may be an analog signal, or a digital signal. A driving circuit or the like may be appropriately designed depending on the video signal.

Furthermore, a light emitting device comprising a cathode, an EL layer, and an anode is referred to as an EL device within this specification. There are two methods of forming the EL devices, a method of forming EL layers between two types of stripe shape electrodes that are formed so that they mutually intersect (passive matrix method), and a method of forming EL layers between pixel electrodes and opposing electrodes that are disposed in a matrix shape and are connected to TFTs (active matrix method). The present invention can be applied to both the passive matrix method and the active matrix method.

BRIEF DESCRIPTION OF THE DRAWINGS

FIG. 8 is a view showing a fabricating system of the present invention. (Embodiment 1)

FIG. 9A and FIG. 9B are views giving an example of a sequence. (Embodiment 2)

FIG. 14A and FIG. 14B are views showing a structure of an element. (Embodiment 4)

FIG. 15A and FIG. 15B are views showing a light-emitting apparatus. (Embodiment 5)

FIG. 16A and FIG. 16B are views showing a light-emitting apparatus. (Embodiment 5)

FIG. 21 shows a related art.

DESCRIPTION OF THE PREFERRED EMBODIMENT

An embodiment mode of the present invention will be described hereinafter.

Embodiment Mode 1

An evaporation source holder that is moved in X-direction or Y-direction in a deposition chamber will be described with reference to FIG. 1A and FIG. 1B.

Figure 1A:
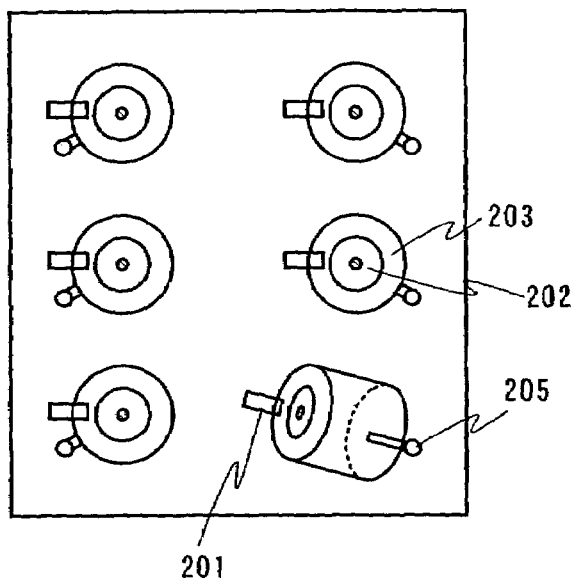
FIG. 1A and FIG. 1B are views showing Embodiment Mode 1.
Figure 1B:
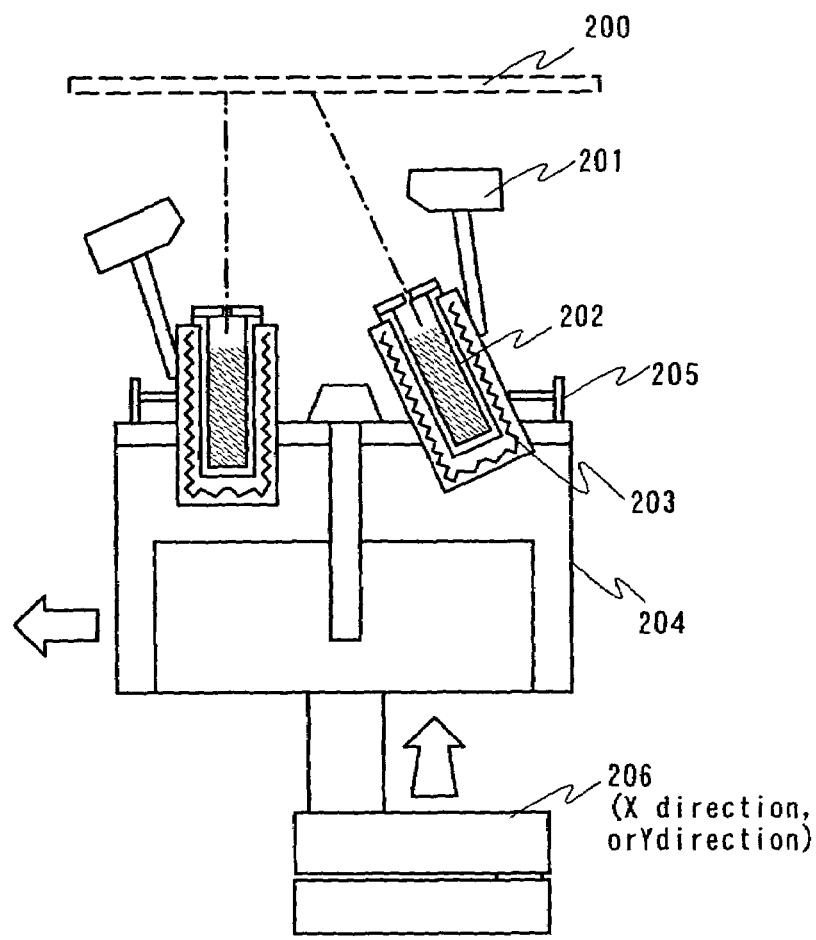

FIG. 1A is a top surface view showing an evaporation source holder 204 having six containers (crucibles) 202. FIG. 1B is a cross-sectional view showing the evaporation source holder 204. Each six crucible has a film-thickness monitor 201. Viewed from the cross-section of the evaporation source holder, one of a container is tilted using a tilt regulating screw 205 against the surface of a substrate 200. Both a tilt regulating screw 205 and a film thickness monitor 201 are located at the side of the container body. The container can be tilted with a heater 203. The heater 203 is used here to carry out vapor deposition by resistance heating.

The vapor deposition can be controlled by using a sliding type shutter (not shown). For example, when an evaporation holder is not beneath the substrate 200, the vapor deposition can be stopped by closing the shutter.

The evaporation source holder 204 is moved with a moving mechanism 206 (typically, two-axis stage) in X-direction or Y-direction on a two-dimensional surface in a deposition chamber.

Figure 2A:
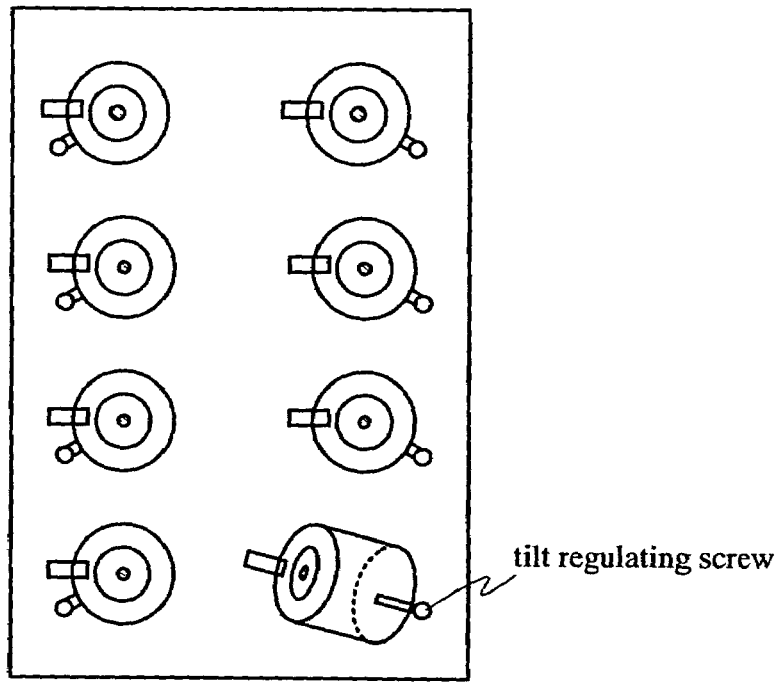
FIG. 2A and FIG. 2B are views showing Embodiment Mode 1.

The evaporation source holder that has six containers is described with reference to FIG. 1A and FIG. 1B, but the present invention is not limited thereto. An evaporation source can have more than six containers. An evaporation source holder that has eight containers is shown in FIG. 2A.

Filling the same materials in plural containers and depositing them simultaneously is enable increased throughput of a low deposition rate material and reduced the deposition time. Even in case resulting film quality is depending on the deposition rate, carrying out the above-mentioned way is enable formed films having same thickness and same quality in the same deposition time.

Figure 2B:
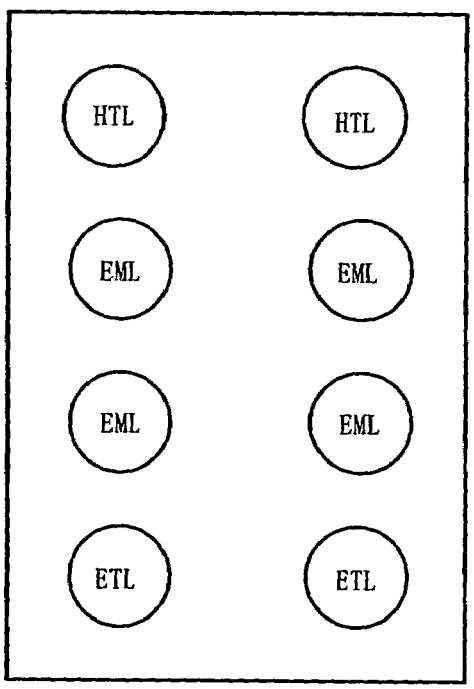

FIG. 2B is a view showing a frame format of an example of filling evaporation materials. In FIG. 2B, two crucibles are filled with materials for a hole transporting layer (HTL), four crucibles are filled with materials for a light emitting layer (EML), and the rest of two crucibles are filled with materials for an electron transporting layer (ETL), among eight crucibles. In this case, firstly, two crucibles are heated to deposit materials for forming a hole transporting layer, secondly, four crucibles are heated to deposit for forming a light emitting layer (EML), and lastly, two crucibles are heated to deposit for forming an electron transporting layer (ETL), sequentially. In case of forming a light emitting layer comprising host materials and luminance materials that has lower excitation energy than that of the host materials, two types of materials are filled with four crucibles so as to set the two crucibles filled with same type of materials are faced each other diagonally.

Figure 7:
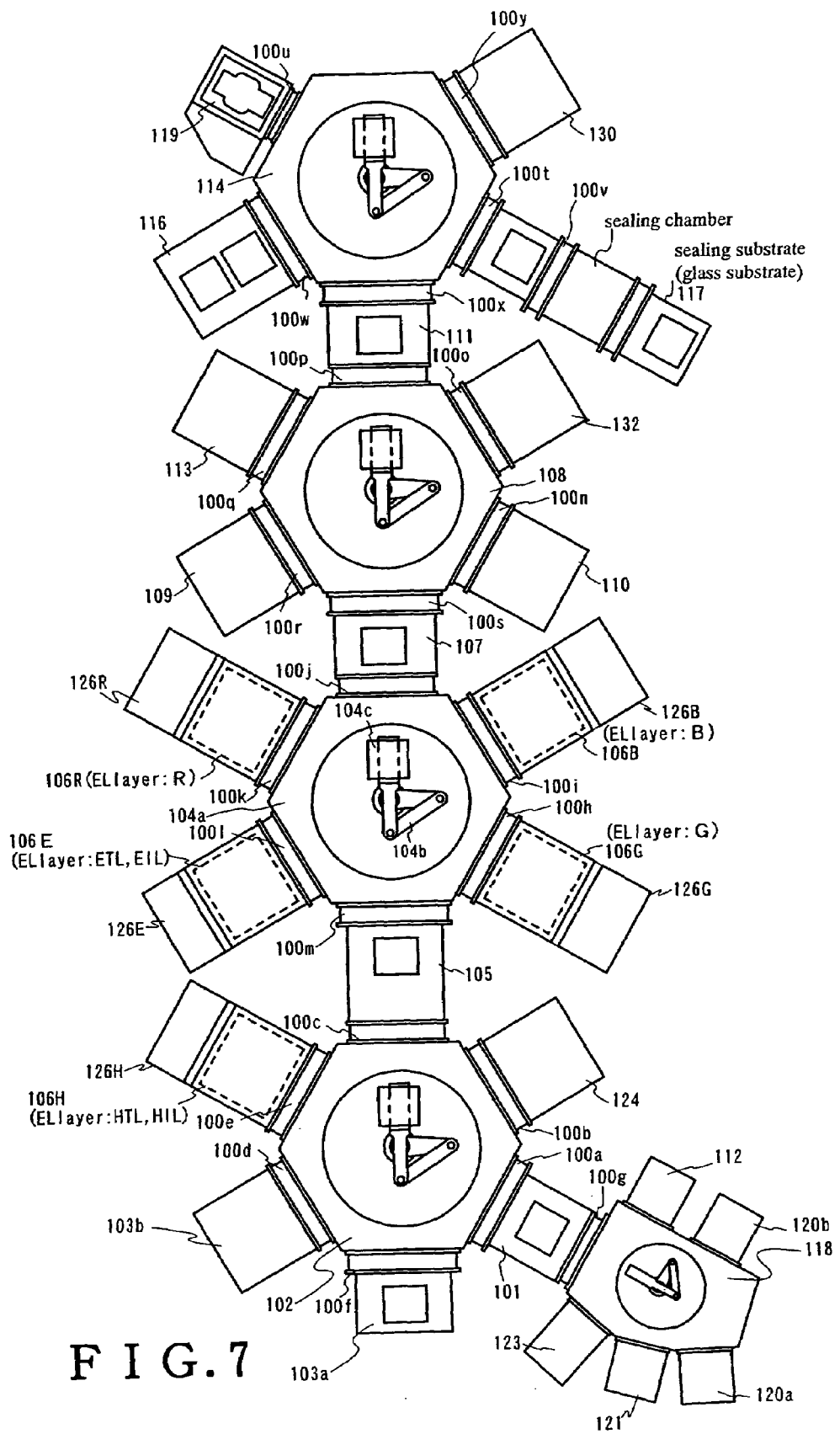
FIG. 7 is a view showing a fabricating system of the present invention. (Embodiment 1)

A multi-chamber type fabrication system (FIG. 7 shows an example thereof) having the above-described deposition chamber is capable of conducting through the fabrication step to the sealing step of a layer containing an organic compound without exposing to the air while preventing moisture from penetrating into a layer containing an organic compound.

Embodiment Mode 2

Figure 3A:
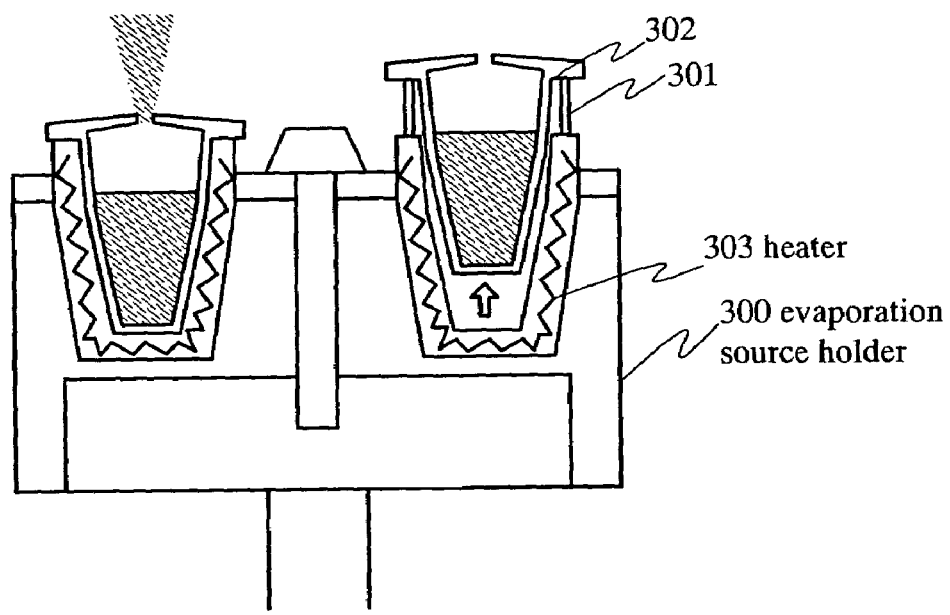
FIG. 3A and FIG. 3B are views showing Embodiment Mode 2.
Figure 3B:
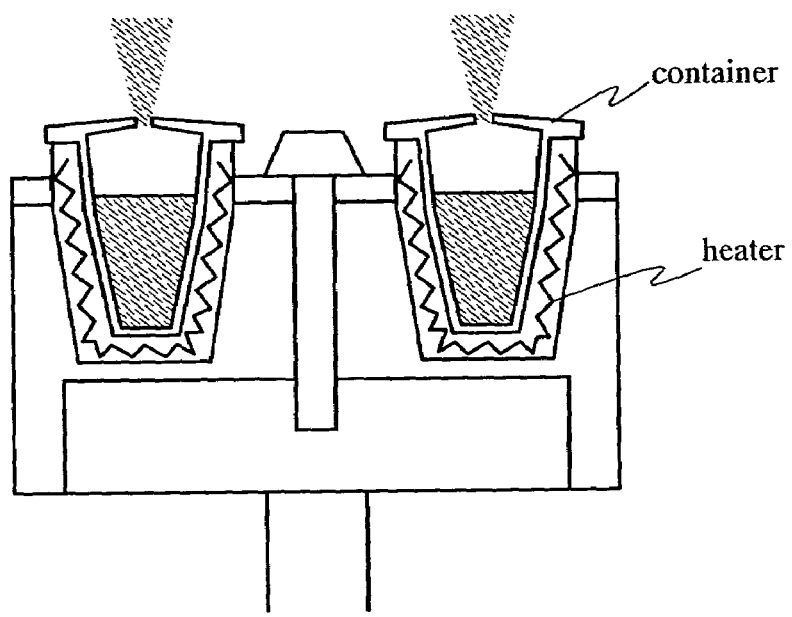
Figure 4A:
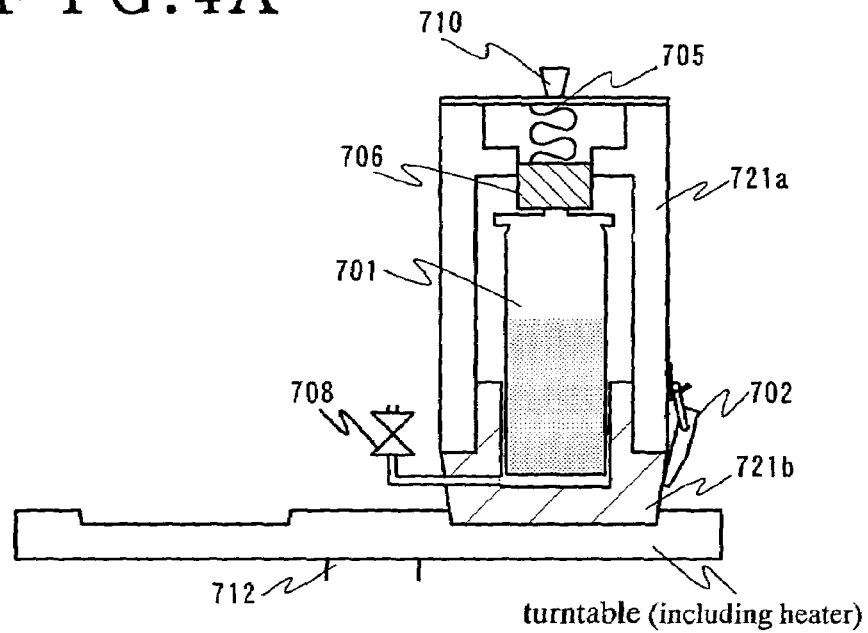
FIG. 4A and FIG. 4B are views showing transportation of a crucible in an installed chamber.
Figure 4B:
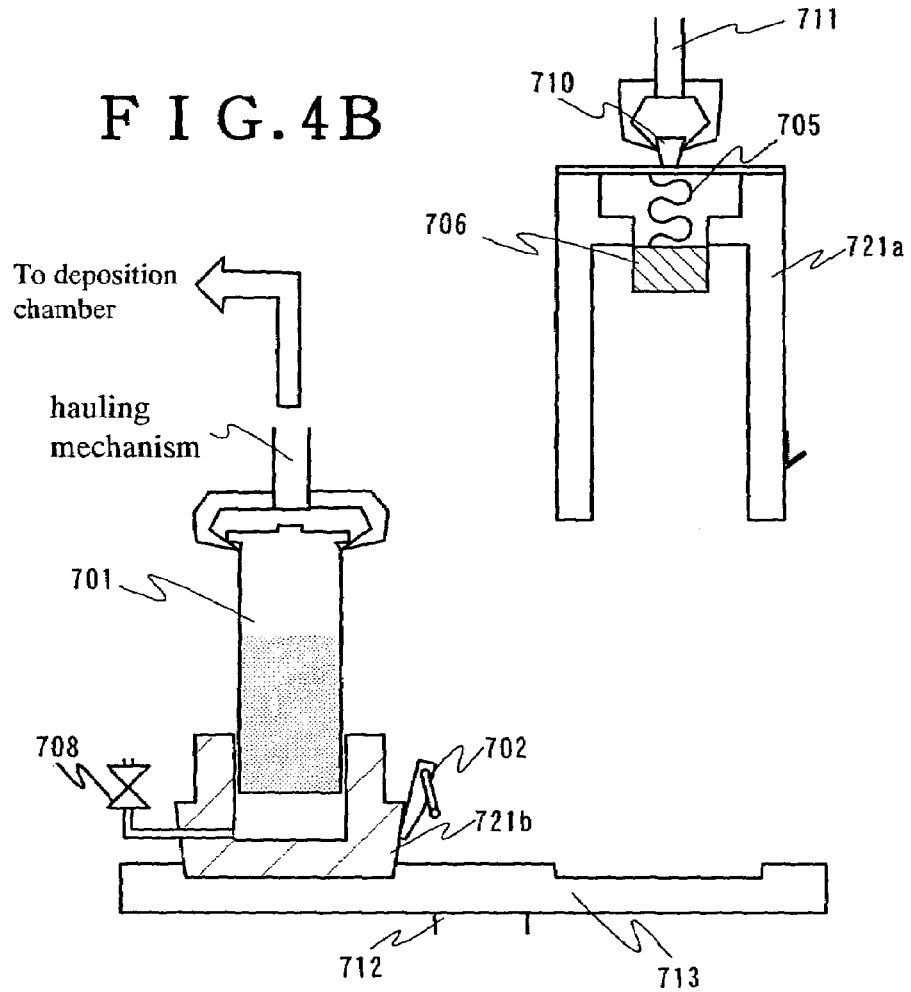
Figure 5A:
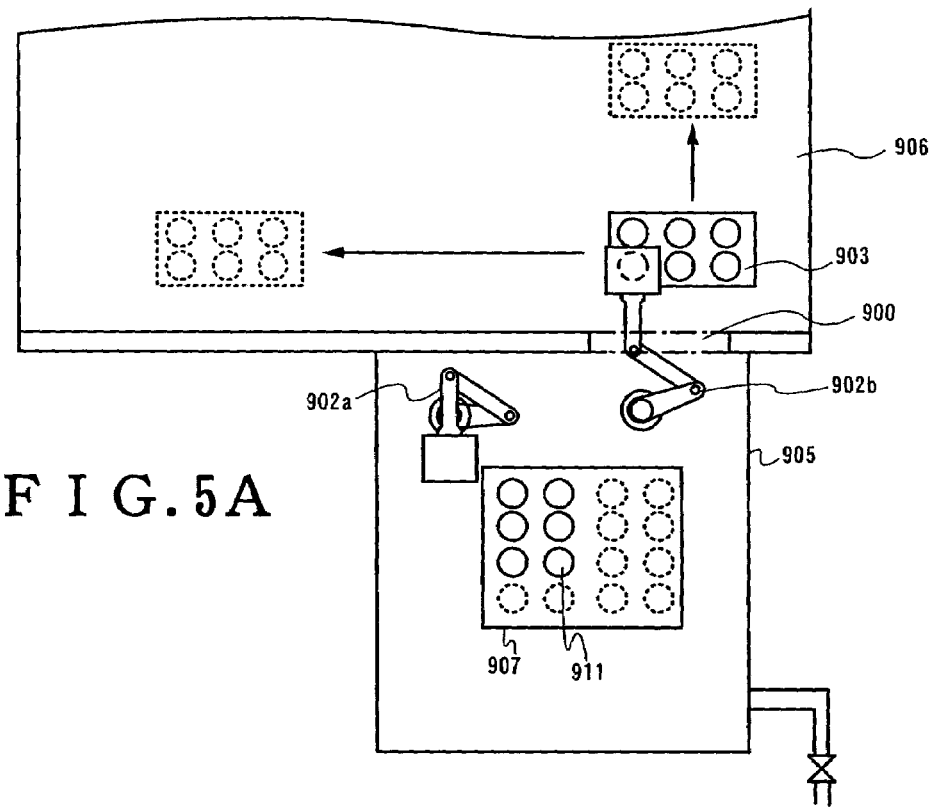
FIG. 5A and FIG. 5B are views showing transportation of a crucible into an evaporation holder in an installed chamber.
Figure 5B:
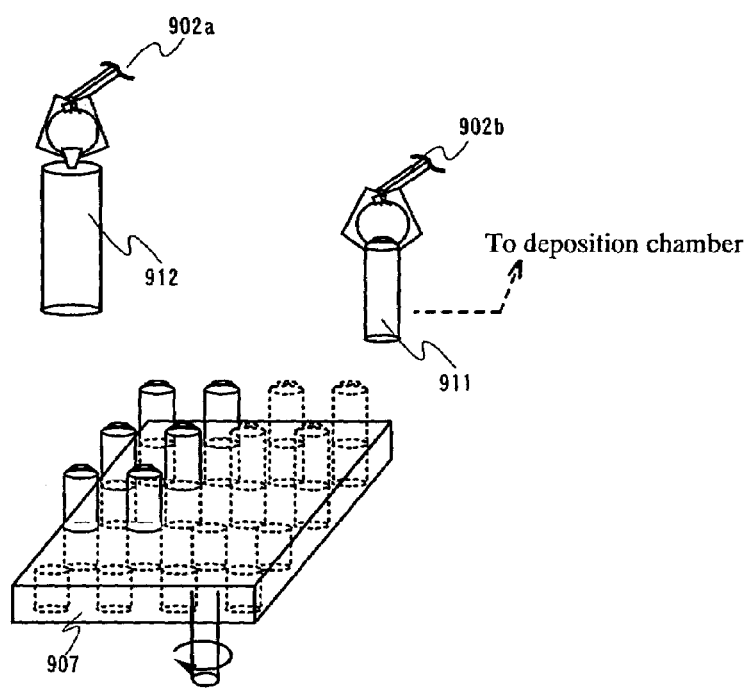

FIG. 3A and FIG. 3B are a views showing an evaporation holder that has no shutter.

FIG. 3A is a view showing the cross sectional view of an evaporation holder 300 in which only one of them carries out vapor deposition. Vapor deposition is stopped by cooling a crucible 302 by lifting the crucible 302 for separating from a heater using a lifting pin 301.

There has been a problem that evaporation materials are still heated by remaining heat even if a power source of the heater is turned OFF, and evaporation materials are evaporated on the shutter, then, a shutter is fixed and stopped moving.

The problem can be solved by the lifting pin 301 shown in FIG. 3A. In order to separate the crucible 302 from the heater, the cross sectional view of the opening of the crucible 302 is formed to be larger than an area of the bottom thereof. The shape of the heater is formed in accordance with the shape of the crucible 302. Forming into such shape, the heater can be separated from the crucibles only lifting by the lifting pin 301 a little. The lifting pin 301 is made of materials having low thermal conductivity, for example, quartz, ceramic, or the like. The crucible 302 is made of materials having high thermal conductivity, for example, titanium for easy heat radiation. The crucible 302 may be formed of a thin inner wall and a thin outer wall for easy heat dissipation.

The state of FIG. 3B is obtained the state when the lifting pin is moved down, evaporation materials filled in both two crucibles are deposited. Therefore, the controlling of deposition is possible even at the state of being heated by the heater. It has been taken the time until reaching the predetermined temperature from turning ON the power source of the heater. According to the present invention, the throughput will be improved by using only lifting pin without using a shutter.

This embodiment mode can be freely combined with Embodiment Mode 1.

Embodiment Mode 3

Figure 6A:
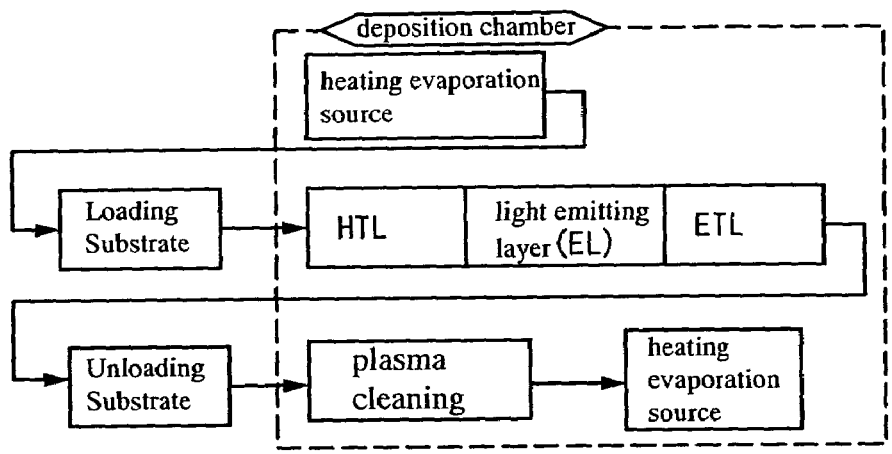
FIG. 6A and FIG. 6B are views showing Embodiment Mode 3.

FIG. 6A is a flowchart showing that cleaning is carried out every time after carrying out deposition to one substrate.

First, an evaporation source is heated before transporting into a deposition chamber, and a substrate is transported to the deposition chamber, then, deposition is started. Materials for a hole transporting layer (HTL), materials for a light emitting layer (EML), materials for an electron transporting layer (ETL) using a deposition mask are sequentially deposited. When the monochrome light emitting device is formed, only one deposition mask is used. Then, vapor deposited substrate is transported from the deposition chamber. In order to clean the deposited materials that are adhered on a deposition mask after transportation of the substrate, the deposited materials are vaporized by plasma generated by a plasma generator in the deposition chamber and exhausted out of the deposition chamber.

Lastly, before the next transportation of a substrate, an evaporation source is heated. FIG. 6A is a flowchart showing up to this process.

Figure 6B:
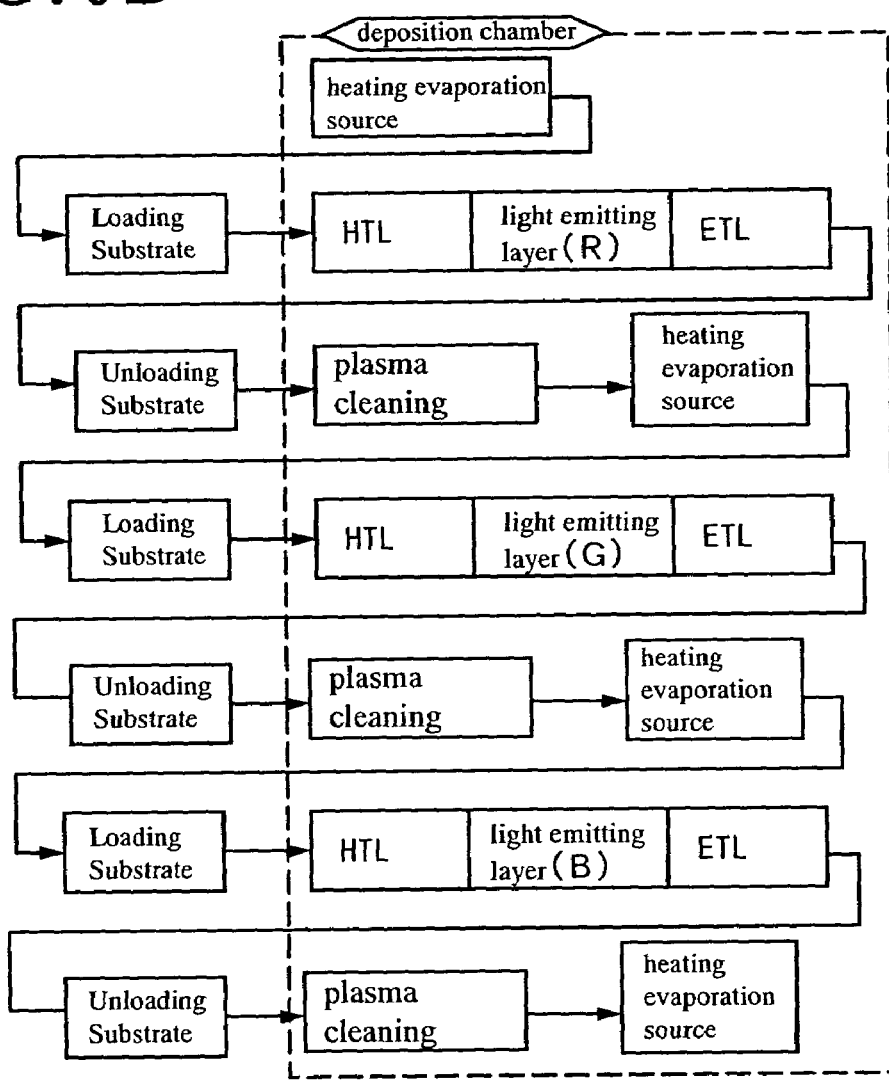

Further, FIG. 6B is a flowchart showing that cleaning is carried out every time after carrying out deposition to one substrate in case of a full color light emitting device is formed.

FIG. 6B shows an example of forming a light emitting layer which generates luminescence of R, G, B in one deposition chamber.

Firstly, an evaporation source is heated before transporting into a deposition chamber, and a substrate is transported into the deposition chamber, then, deposition is started. Materials for a hole transporting layer (HTL), materials for a light emitting layer (EML) for R luminescence, materials for an electron transporting layer (ETL) are sequentially deposited using a (first) deposition mask. Then, vapor deposited substrate is transported from the deposition chamber. In order to clean the deposited materials that are adhered on a deposition mask after transportation of the substrate, the deposited materials are vaporized by plasma generated by a plasma generator in the deposition chamber and exhausted out of the deposition chamber.

Secondly, a vapor deposited substrate for a light emitting layer (R) is transported into a deposition chamber. Before the transportation of the substrate, an evaporation chamber is heated. Next, materials for a hole transporting layer (HTL), materials for a light emitting layer (EML) for green luminescence, and materials for an electron transporting layer (ETL) are deposited using a (second) deposition mask to be sequentially laminated. Then, vapor deposited substrate is transported from the deposition chamber. After the transportation of the substrate, cleaning of evaporated materials that are adhered to inside of the deposition chamber is carried out.

Thirdly, a vapor deposited substrate for a light emitting layer (R) and a light emitting layer (G) is transported into a deposition chamber. Before the transportation of the substrate, an evaporation chamber is heated. Next, materials for a hole transporting layer (HTL), materials for a light emitting layer (EML) for blue luminescence, and materials for an electron transporting layer (ETL) are deposited using a (third) deposition mask to be sequentially laminated. Then, vapor deposited substrate is transported from the deposition chamber. A light emitting layer for R, G, B can be formed on the substrate during this process.

After the transportation of the substrate, cleaning of deposited materials that are adhered to inside of the deposition chamber is carried out. FIG. 6B is a flowchart showing up to this process.

This embodiment mode can be freely combined with Embodiment Mode 1 or Embodiment Mode 2.

Embodiment Mode 4

A light emitting apparatus formed by a vapor deposition system described in Embodiment Mode 1 according to the present invention will be described with reference to FIGS. 10A-C.

In a deposition system described in Embodiment Mode 1, an interval of a substrate and an evaporation source is reduced below 20 cm, preferably, be in the range of 5 cm to 15 cm, and deposition is carried out using the same mask for depositing a hole injecting layer, a hole transporting layer, a light emitting layer, or an electron transporting layer so that the edge portion thereof is flushed with each other and have no contact with adjacent pixels.

Figure 10A:
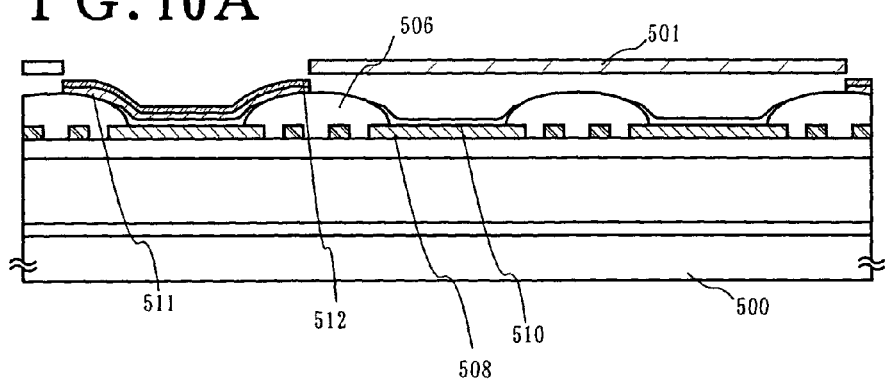
FIG. 10A to 10C are cross sectional views of a light emitting region. (Embodiment Mode 4)

FIG. 10A is a view showing the positional relationship of a deposition mask 501 and a substrate 500 that will be subjected deposition. However, since deposition is practically carried out by a face down method, top and bottom of the substrate is reversed when the vapor deposition is carried out.

As shown in FIG. 10A, TFT (not shown), a first electrode 508 connected to the TFT, a bank (typically, photosensitive resin) 506 that covers each end portion of the first electrode 508, and a hole injecting layer 510 formed by coating on the surface of the first electrode that is not covered by the bank. For example, an aqueous solution of poly (ethylene dioxythiophene)/poly(styrene sulfonic acid) (PEDOT/PSS) is coated on the entire surface and baked to form a hole injecting layer. Particularly, when concave/convex or particles are on the surface, forming PEDOT/PSS to have a thickness of not less than 30 nm can be a means of preventing the adverse effects of the concave/convex or the particles.

Further, PEDOT/OSS coated on an ITO film does not have good wettability. It is therefore preferable to improve the wettability by cleaning with pure water once after carrying out spin coating of PEDOT/PSS solution. Moreover, it is preferable that PEDOT/PSS solution is spin coated again and baked to be formed uniformity. Note that cleaning the substrate with pure water once after the first coating is effective in improving surface quality, and is also effective in removing particles or the like.

Figure 11A:
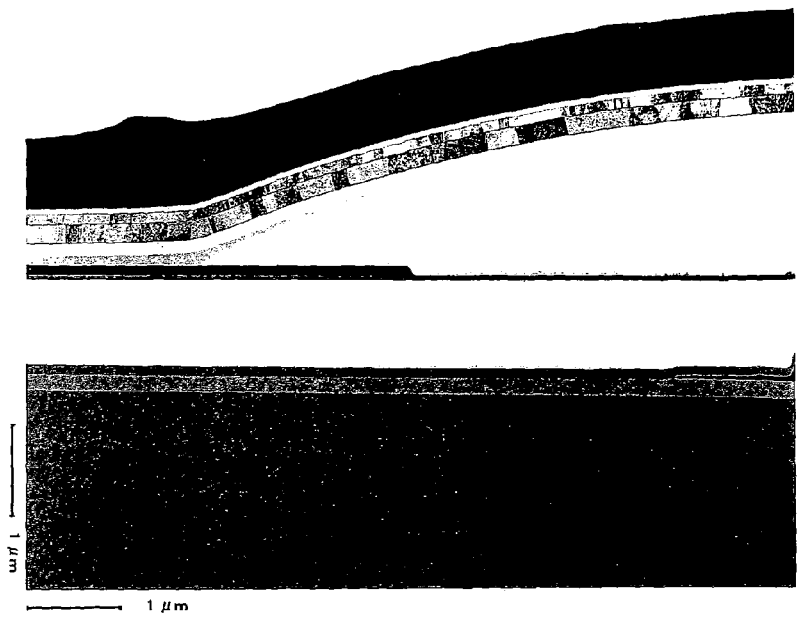
FIG. 11A is a cross sectional TEM photo and 11B is a patterning diagram. (Embodiment Mode 4)
Figure 11B:
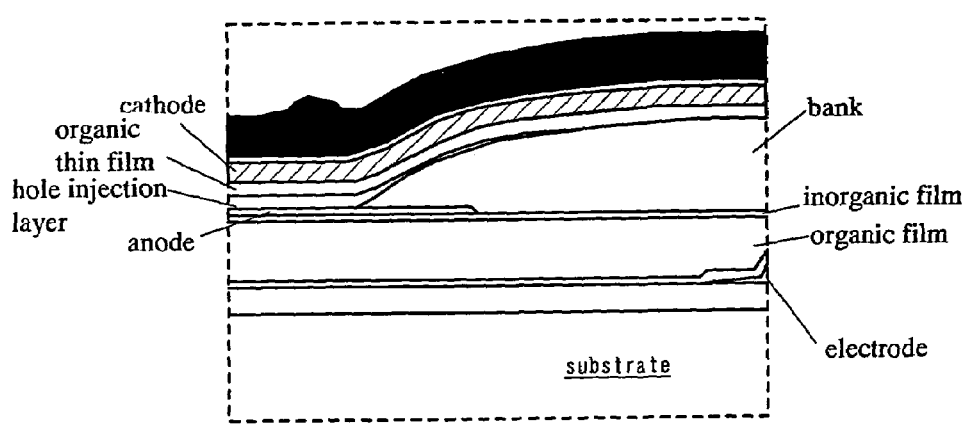

FIG. 11A is a TEM photograph of cross-sectional view of the device after forming a second electrode. FIG. 11B is a view showing the frame format of FIG. 11A. Note that PEDOT/PSS is formed to have a thickness of approximately 90 nm on a first electrode.

A top edge portion and a bottom edge portion of a bank is formed to have a curved surface with a curvature so that the hole injecting layer is formed to be thin at the side wall of the bank having a gentle slope even when spin coating is used to form the hole injecting layer. Preferably, the bank should be characterized in that a conductive polymer (the hole injecting layer) is not formed on top thereof.

Consequently, cross talk can be effectively prevented by the structure as shown in FIG. 11A wherein PEDOT/PSS that is the hole injecting layer is not formed on top of the bank though it is formed at the side wall of the bank having a gentle slope.

Instead of PEDOT/PSS, a material that can be formed by coating, for example, polypyrrole that is conductive polymer palladiumized can be used.

A light emitting layer 511 and an electron transporting layer 512 is formed at an opening portion of a mask 501 by carrying out vapor deposition to the substrate 500. Further, a second electrode 507 is preferable to be formed by resistance heating.

FIG. 10A is a cross sectional view showing the state in which vapor deposition is carried out to one pixel area among three pixel areas. FIG. 10B is a top view of showing the state in which three pixel areas, R, G, B are deposited, and then a second electrode 507 and a transparent protective lamination layer 502 are formed. FIG. 10C is a cross sectional view of FIG. 10B. In FIG. 10B, an enclosed region by a dotted line is a light emitting region and another region is a portion that is formed on the bank. The light emitting layer 511 and an electron transporting layer 512 is formed using a same mask, so that it is easy to form the edge portion thereof to flush with each other and to be not contact with the adjacent pixels for preventing short-circuit. Since the wrap-around portion of a mask is different depending on the type of material or the deposition rate, the edge portion of a bottom layer is preferable to be covered in case of laminating plural layers.

A transparent protective lamination film 502 is formed by sputtering or vapor deposition on the second electrode. As shown in FIG. 10C, the transparent protective lamination layer 502 comprises a first inorganic insulating film, a stress relaxation film, and a second inorganic insulating film. A silicon nitride film, a silicon oxide film, a silicon oxynitride film (SiNO film (a composition ratio of N>O) or SiON film (a composition ratio of N<O), or a thin film containing carbon as its main component (for example, DLC film, CN film) obtained by sputtering or CVD can be used for forming the first inorganic insulating film and the second inorganic insulating film. These inorganic insulating films have high moisture blocking efficiency, however, are subject to film peeling due to increasing membrane stress resulted from thickening the film thickness. In view of this, a stress relaxation film is interposed between the first inorganic insulating film and the second inorganic insulating film so as to relax the stress and absorb moisture. Further, even when microfracture (pin hole or the like) is generated for some causes on the first inorganic insulating film, it can be filled with the stress relaxation film. And the transparent protective lamination layer 502 can be given extremely high blocking effect against moisture or oxygen by having the structure of laminating the second inorganic insulating film on the stress relaxation film.

For the stress relaxation film, it is preferable to use a material that has smaller stress than that of an inorganic insulating film and has hygroscopic property, in addition, translucency. As a material for the stress relaxation film, a material film contains the following organic compounds, a-NPD (4,4'-bis [N-(1-naphthyl)-N-phenyl-amino]-biphenyl), BCP (batho-cuproine), MTDATA (4,4',4''-tris[N-(3-methylphenl)-N-phenyl-amino]-triphenylamine), Alq$_3$ (tris (8-quinolinolato) aluminum). These material films having hygroscopic property and almost transparent if they have thin film thickness. Since MgO, SrO$_2$, SrO have hygroscopic property and translucency and can be deposited to be a thin film, they can be used for the stress relaxation film.

A material for a layer containing an organic compound interposed between a cathode and an anode can be used for the stress relaxation film.

In case that the inorganic insulating film can be formed by sputtering (or CVD), and the stress relaxation film can be formed by vapor deposition, the substrate is transported back and fourth between a deposition chamber and a sputtering chamber (or CVD chamber). It gives the merit of eliminating the need for forming another deposition chamber. An organic resin film is considered as an appropriate material for the stress relaxation film, however, there is a problem of increasing the number of steps, contamination due to solvents, thermal damage due to baking, or degassing, since the organic resin film requires baking or the like because of using solvents.

The transparent protective lamination layer 502 is appropriate for a sealing film for light emitting device in which a layer containing an organic compound is used as a light emitting layer. In addition, the transparent protective lamination layer 502 has hygroscopic property so as to play a roll of removing moisture.

A first electrode 508 serves as an anode for a light emitting device and a second electrode 507 serves as a cathode of the light emitting device. For the materials of the first electrode 508, an element selected from Ti, TiN, TiSix, Ny, Ni, W, WSi$_x$, WN$_x$, Wsi$_x$N$_y$, NbN, Mo, Cr, Pt, Zn, Sn, In, or Mo, a film containing an alloy material as its main component or a compound material containing the above elements as its main component, or a lamination film comprising these films can be used in the range of a total thickness of 100 nm to 800 nm. For the materials of the second electrode 507, an alloy such as MgAg, MgIn, AlLi, CaF$_2$, CaN, or a film having translucency fabricated by co-evaporation of an element belonged to the first group or the second group of a periodic table and aluminum can be used.

Figure 10B:
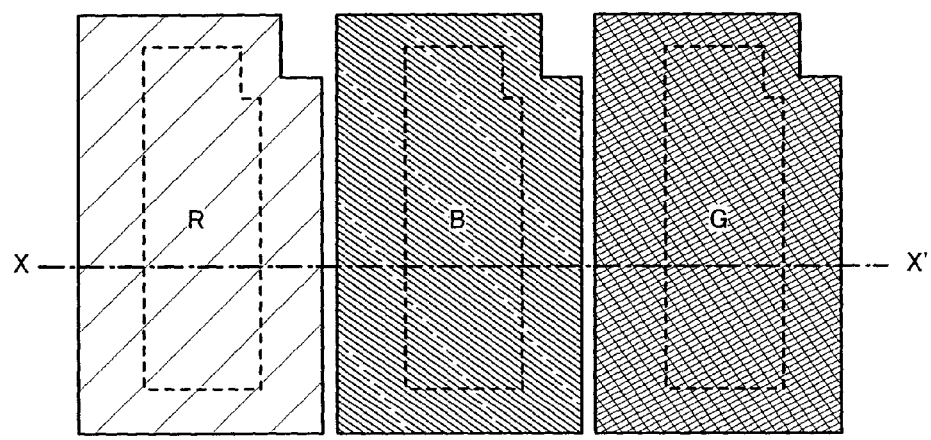
Figure 10C:
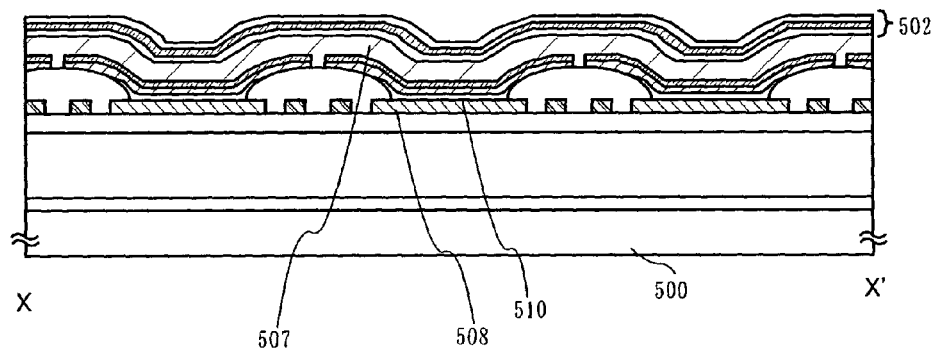
Figure 12A:
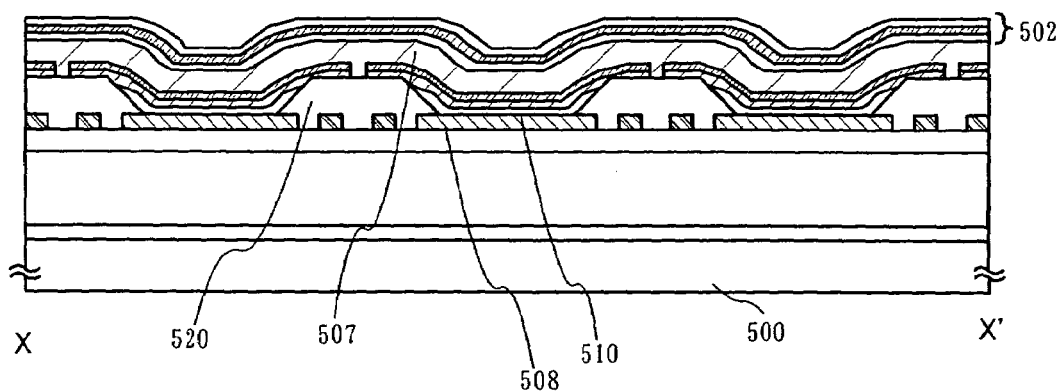
FIG. 12A and FIG. 12B are cross-sectional views of a light-emitting region. (Embodiment Mode 4)
Figure 12B:
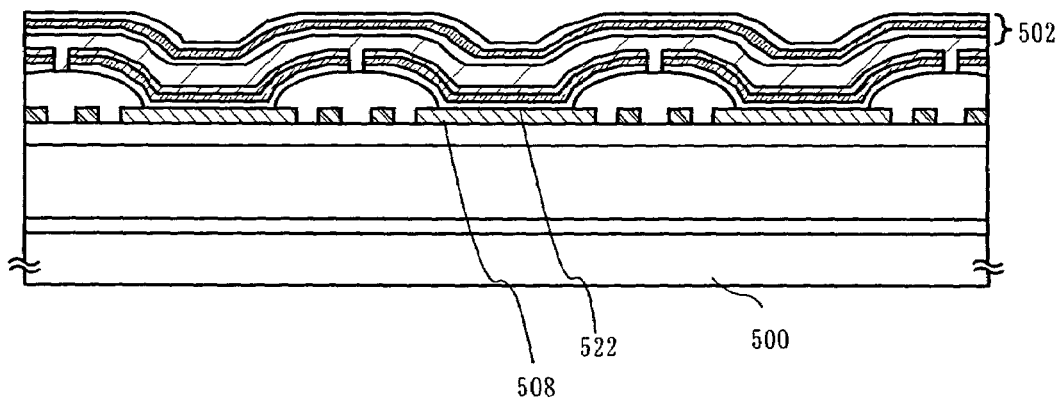

FIG. 12A and FIG. 12B are views showing partly different examples from that of FIGS. 10A-C. An example of a bank that has a curved surface having a curvature is shown in FIG. 10C. In FIG. 12A, an example of a bank 520 made from a nonphotosensitive resin and formed into a tapered shape is shown. In FIG. 12A and FIG. 12B, like components except the bank 520 are denoted by like numerals as of FIGS. 10A-C. In the event that a hole injecting layer 522 is fabricated by vapor deposition as shown in FIG. 12B, the hole injecting layer 522, a light emitting layer 511, and an electron transporting layer 512 are preferable to be formed using the same mask.

This embodiment mode can be freely combined with Embodiment Mode 1, 2, or 3.

Above described compositions composing the present invention will be described in more details in the following embodiments.

EMBODIMENTS

Embodiment 1

In this embodiment, an example of a multi-chamber type fabrication system in which through the fabrication steps of a first electrode to the sealing step is full-automated is illustrated in FIG. 7.

FIG. 7 is a view of a multi-chamber type fabrication system comprising gates 100a to 100y, transport chambers 102, 104a, 108, 114, 118, delivery chambers 105, 107, 111, a feed chamber 101, a first deposition chamber 106H, a second deposition chamber 106B, a third deposition chamber 106G, a fourth deposition chamber 106R, a fifth deposition chamber 106E, another deposition chamber 109, 110, 112, 113, 132, an installation chamber 103a, 103b, a sealing chamber 116, a mask stock chamber 124, a sealing substrate stock chamber 130, cassette chambers 120a, 120b, a stage for mounting a tray 121, and a receipt chamber 119. It is noted that a transport mechanism 104b for transporting a substrate 104c is provided with the transport chamber 104a and a transport mechanism is provided similarly with each of the other transport chambers.

Hereinafter, an example of a fabrication procedure of a light emitting apparatus will be explained with reference to FIG. 7 in which a substrate on which an anode and an insulator (a bank) for covering an edge portion of the anode formed in advance is transported into the fabrication system. In case that an active matrix type light emitting apparatus is fabricated, for, example, a substrate on which a plurality of thin film transistors (current controlling TFTs) connected to the anode, another plurality of transistors such as switching TFTs, and a drive circuit composed of thin film transistors are formed in advance are formed is used for the active matrix type light emitting apparatus. In addition, a passive matrix type light emitting apparatus can also be fabricated with the fabrication system shown in FIG. 7.

First, the above substrate is set in the cassette chamber 120a or the cassette chamber 120b. In case of a large-sized substrate (for example, 300 mm×360 mm), the substrate is set in the cassette chamber 120a. In case of a normal substrate (for example, 127 mm×127 mm), the substrate is transported into the stage for mounting a tray 121 and a plurality of substrates are set on the tray (for example, 300 mm×360 mm) after setting the substrate in the cassette chamber 120a.

The set substrate (in which an anode and an insulator for covering an edge portion of the anode are provided) is transported into the transport chamber 118.

It is preferable to wash a surface of the first electrode with a porous sponge, typically, made from such as PVA (polyvinyl alcohol) or nylon and soaked in a surfactant (weak alkaline) to remove dust on the surface before setting in the cassette chamber in order to reduce point defects. As a washing mechanism, a washing equipment with a roll brush of PVA that turns an axis in parallel with a face of a substrate to touch a surface of the substrate, or a washing equipment with a disc brush of PVA that turns an axis in parallel with a face of a substrate to touch a surface of the substrate may be used. Further, it is preferable to perform annealing for degassing in vacuo before forming a film containing an organic compound in order to remove moisture and other gas contained in the above substrate, and annealing may be performed to in a pretreatment chamber 123 connected to the transport chamber 118.

Next, the substrate is transported from the transport chamber 118 installed with a transport mechanism into the feed chamber 101. In the fabrication system in this embodiment, a robot installed with the transport chamber 118 can reverse a substrate and transport the reversed substrate into the feed chamber 101. Inside the transport chamber 118 is kept atmospheric pressure in this embodiment. It is preferable to introduce inert gas to become the atmospheric pressure in the feed chamber 101 connected to an evacuation treatment chamber after performing evacuation.

Next, the substrate is transported into the transport chamber 102 coupled with the feed chamber 101. It is preferable to evacuate in advance and keep vacuum in the transport chamber 102 in order to reduce moisture and oxygen as much as possible.

For the above evacuation treatment chamber, a magnetic levitation type turbo molecular pump, a cryo-pump, or a dry pump is provided. Accordingly, it is possible to make the degree of vacuum reach $10^{-5}$ to $10^{-6}$ Pa in the transport chamber coupled with the feed chamber and control reverse diffusion of an impurity from the pump side and the exhaustion system. In order to prevent an impurity from being introduced into the inside of the fabrication system, inert gas such as nitrogen or rare gas, which is highly purified with a gas purification equipment in advance, is introduced into the inside of the fabrication system. Therefore, it is necessary to provide a gas purification equipment in order to introduce highly purified gas into the equipment. With the above, it is possible to remove oxygen and moisture contained in gas and other impurities in advance, so that it is possible to prevent them from being introduced into the equipment.

If a film containing an organic compound formed in an unnecessary portion of a substrate needs to be removed, the substrate may be transported into the pretreatment chamber 103a and removed selectively the lamination of the organic compound film. A plasma generator is installed with the pretreatment chamber 103a, and dry etching is carried out by generating plasma with excited one type or plural types of gas selected from Ar, H, F, or O in the pretreatment chamber. Using mask can remove only unnecessary portions of the organic compound film selectively. In addition, UV radiation mechanism may be installed with the pretreatment chamber 103a for carrying out UV irradiation as an anode surface treatment.

Further, it is preferable to perform vacuum heating just before carrying out vapor deposition to a film containing an organic compound in order to prevent a phenomenon (shrink) of expanding a non-light emitting region from a peripheral portion of a pixel, and the substrate is transported into the pretreatment chamber 103b and annealed for degassing in vacuo of not more than $5\times10^{-3}$ Torr (0.665 Pa), preferably, in the range of $10^{-4}$ to $10^{-6}$ Pa, in order to remove water and other gas contained in the above substrate drastically. In the pretreatment chamber 103b, a flat-plane heater (typically, a heater) is used to heat a plurality of substrates uniformly. There are plural flat-plane heaters that can heat both surfaces of the substrate by sandwiching the substrate, or only one of the surfaces. Especially, in the case of using an organic resin film as a material for an interlayer insulating film or a bank, it is effective to carry out vacuum heating before forming a film containing an organic compound at 100 to 250° C., preferably 150 to 200° C., for not less than 30 minutes and cooling naturally for 30 minutes since moisture is easily to be adsorbed and degassing may be occurred.

It is preferable that heating is carried under an atmospheric pressure of an inert atmosphere before carrying out vacuum heating. Time required by vacuum heating can be reduced by heating under an atmospheric pressure of an inert atmosphere in advance. Further, it is preferable that UV irradiation is carried out to remove organic substance (refuse) and to improve work functions (work functions of ITO as an anode). The substrate is preferable to be transported into a vacuum chamber and baked immediately after carrying out UV irradiation since an efficiency of UV irradiation of an increase of work functions is weak over time.

Thus, as a preferable order of steps for reducing shrink, the anode surface is cleaned using a porous sponge, and heated under nitride atmosphere (atmospheric pressure) at 200° C. for 1 hour, then, UV irradiated for 370 seconds, and then, vacuum heated for 30 minutes at 150° C. (moreover, cooled for 30 minutes). According to this, a light emitting device can be fabricated effectively.

Next, the substrate is transported from the transport chamber 102 to the delivering chamber 105, and then transported from the delivering chamber 105 to the transport chamber 104a without exposing to the air.

Then, the substrate is transported appropriately into the deposition chambers 106R, 106G, 106B, 106E coupled with the transport chamber 104a, and deposited an organic compound layer made from low molecular materials to form a hole injecting layer, a hole transporting layer, a light emitting layer, an electron transporting layer, and an electron injecting layer. Or, the substrate can be transported into the deposition chamber 106H from the transport chamber 102 to carry out vapor deposition.

Further, a hole injecting layer made from polymer materials may be formed under atmospheric pressure or reduced pressure by ink-jet or spin-coating in the deposition chamber 112. With putting the substrate vertically, the hole injecting layer may be formed with ink-jet in vacuo. A material that functions as a hole injecting layer (an anode buffer layer), such as poly (ethylenedioxythiphene)/polystyrenesulphonic acid (PEDOT/PSS), camphor sulfonic acid in polyaniline (PANI/CSA), PTPDES, Et-PTPDEK, or PPBA may be entirely applied on the anode and baked. It is preferable that baking is performed in the baking chamber 123. In the case of forming the hole injecting layer of a polymer material by a coating method such as spin-coating, the flatness is improved and it is possible to make a coverage and an uniformity of a film thickness better with respect to a film formed thereon. Since a film thickness of a light emitting layer becomes uniform especially, uniform emission of light can be obtained. In this case, it is preferable to carry out vacuum heating (100 to 200° C.) just before carrying out deposition after forming the hole injecting layer with coating. The vacuum heating may be performed in the pretreatment chamber 103b. A light emitting layer is fabricated by vapor deposition without exposing to the air, for example, as following; the surface of the first electrode (anode) is washed with a sponge, and the substrate is transported into the cassette room, then, transported into the deposition room 112 to be coated poly (ethylenedioxythiphene)/polystyrene-sulphonic acid (PEDOT/PSS) entirely with spin-coating to have a thickness of 60 nm. After that, the substrate is transported into the baking room 123 to be pre-baked at 80° C. for 10 minutes and baked at 200° C. for 1 hour, and transported into the pretreatment chamber 103b to be vacuum heated (at 170° C. for 30 minutes and cooled for 30 minutes) just before carrying out deposition, then, transported into the deposition chambers 106R, 106G, and 106 B. Especially, in the case that an ITO film is used as a material for the anode and a surface is uneven and minute particles exist on the surface, it is possible to eliminate the harmful effects thereof by forming PEDOT/PSS to have a thickness of not less than 30 nm.

Since PEDOT/PSS coated on the ITO film does not have a good wettability, it is preferable to perform washing with pure water once after coating firstly PEDOT/PSS solution by spin-coating to improve wettability, and coating secondly PEDOT/PSS solution by spin-coating, then, baking for forming a film uniformly. It is noted that it is possible to remove particles or the like in addition to improving the surface by washing with pure water once after coating PEDOT/PSS solution firstly.

In the case of forming a hole transporting layer entirely by spin-coating, it is preferable to remove selectively an edge portion of the layer and a periphery portion of the substrate, a terminal portion, a contact portion of a cathode and a lower wiring by $O_2$-ashing, or the like using a mask in the pretreatment chamber 103a.

The deposition chambers 106R, 106G, 106B, 106E, and 106H will be described hereinafter.

In each deposition chamber 106R, 106G, 106B, 106E, and 106H, a plurality of movable evaporation source holders are set up. Crucibles in which an EL material is filled are appropriately set in each of the plurality of movable evaporation source holders. In order to carry out deposition selectively, the substrate is set by face down method, a positional alignment of a deposition mask is performed with CCD or the like, and evaporation is carried out by resistance heating. The deposition mask is stoked in the mask stock chamber 124, and transported appropriately into the deposition chamber when deposition is carried out. A vapor deposited film can be stocked in the mask stock chamber because the mask stock chamber is vacant during the deposition. The deposition chamber 132 is a spare chamber for forming a layer containing an organic compound or metal material layer.

It is preferable to use a fabrication system shown below for setting EL materials up in these deposition chambers. That is, it is preferable to carry out deposition using a container (typically, a crucible) in which an EL material is filled in advance by a material maker. In addition, it is preferable to perform setting the EL material up without exposing to the air, and to transport the crucible in an airtight container into the deposition chamber that is received from the material maker. Desirably, the installation chambers with evacuation means 126R, 126G, 126B, 126H, and 126E, coupled with the respective deposition chambers 106R, 106G, 106B, 106H, and 106E, is evacuated air thereof or formed to have inert gas atmosphere. The crucible is taken out from the airtight container in the installation chamber and set up in the deposition chamber. It is possible to prevent the crucible and the EL material filled in the crucible from contamination. Further, a metal mask can be stocked in each of the installation chamber 126R, 126G, 126B, 126H, and 126E.

By selecting appropriately an EL material set in each of the deposition chambers 106R, 106G, 106B, 106H, and 106E, an EL device that emits light of a single color (specifically, white) or light of a full color (specifically, red, green, and blue) can be fabricated. In the case of forming an EL device for green, for example, a hole transporting layer or a hole injecting layer formed in the deposition chamber 106H, a light emitting layer (G) formed in the deposition chamber 106G, and an electron transporting layer or an electron injecting layer formed in the deposition chamber 106E, may be laminated in order, and then a cathode may be formed to obtain the EL device for green. Further, an EL device for a full color is formed for example, as the following; a hole transporting layer or a hole injecting layer, a light emitting layer (R), and an electron transporting layer or an electron injecting layer may be laminated using a deposition mask for red in the deposition chamber 106 R, a hole transporting layer or a hole injecting layer, a light emitting layer (G), and an electron transporting layer or an electron injecting layer may be laminated using a deposition mask for green in the deposition chamber 106 G, a hole transporting layer or a hole injecting layer, a light emitting layer (B), and an electron transporting layer or an electron injecting layer may be laminated using a deposition mask for blue in the deposition chamber 106 B, and then a cathode may be formed.

An organic compound layer generating white luminescence is classified into a three-wavelength type containing three primary colors of red, green, and blue, and a two-wavelength type using a relation of a complementary color such as blue and yellow, or bluish green and orange in the case of laminating light emitting layers generating different luminescence in color. It is possible to form an EL device for white in one deposition chamber. For example, in the case of obtaining a white luminescence EL device using a light emitting layer of the three-wavelength type, a plurality of evaporation source holders are prepared in one deposition chamber, and the first evaporation source holder in which (TPD) is filled, the second evaporation source holder in which p-EtTAZ filled, the third evaporation source holder in which $Alq_3$ filled, the fourth evaporation source holder in which an EL device (in which a pigment for emitting red is added to $Alq_3$) filled, the fifth evaporation source holder in which $Alq_3$ filled are set in the deposition chamber. Then, the first to fifth evaporation source holders are started to move sequentially, evaporation is carried out to a substrate, and layers are laminated. Specifically, TPD is sublimated from the first evaporation source holder by heating and deposited on the entire substrate. Then similarly, p-EtTAZ, $Alq_3$, $Alq_3$: NileRed, and $Alq_3$ are respectively sublimated from the second to fifth evaporation source holders and deposited on the entire substrate. After that, a cathode is formed, and the white luminescence EL device can be completed.

After a layer containing an organic compound is laminated appropriately in accordance with the above process, the substrate is transported from the transport chamber 104a into the delivering chamber 107 and transported from the delivering chamber 107 into the transport chamber 108 without exposing to the air.

Next, the substrate is transferred to the deposition chamber 110 by the transferring mechanism set within the transport chamber 108 to form a floating electrode, which is a metal film (an alloy such as MgAg, MgIn, $CaF_2$, LiF, or $Ca_3N_2$, a film formed with co-evaporation of aluminum and an element belonging to group 1 or 2 of the periodic table, or a laminate film of the above) formed with evaporation that uses resistance heating.

In the case of manufacturing a top-emission type light emitting apparatus, it is preferable that the cathode is transparent or translucent and formed of a thin film (1 to 10 nm) of the above metal film or a laminate of a thin film (1 to 10 nm) of the above metal film and a transparent conductive film. In this case, a film of a transparent conductive film (ITO: an alloy of indium oxide and tin oxide, $In_2O_3$—ZnO: an alloy of indium oxide and zinc oxide, or ZnO: zinc oxide) may be formed by sputtering in the deposition chamber 109.

In accordance with the above process, the light emitting device of the present invention is formed.

In addition, the substrate may be transported into the deposition chamber 113 coupled with the transport chamber 108 to form a protective film made of a silicon nitride film or a silicon oxynitride film for using as a sealing film. Here, a target of silicon, silicon oxide, or silicon nitride is provided in the deposition chamber 113. For example, a silicon nitride film can be formed on the cathode by using the target of silicon and forming a nitrogen atmosphere or an atmosphere containing nitrogen and argon in the deposition chamber. Further, a thin film consisting mainly of carbon (a DLC film, a CN film, or an amorphous carbon film) may be formed as the protective film, or another deposition chamber with CVD may be provided separately. The diamond-like carbon (also referred to as the DLC film) can be formed with a method such as plasma CVD, (typically, RF plasma CVD, microwave CVD, electron cyclotron resonance (ECR) CVD, or hot filament CVD), combustion-flame, sputtering, ion beam evaporation, or laser evaporation, reaction gas used for the deposition that is composed of hydrogen gas and hydrocarbon gas (for example, $CH_4$, $C_2H_2$, or $C_6H_6$) is subjected to ionization with glow discharge, and ions are accelerated for collision against a cathode to which negative self-bias is applied to perform the deposition. The CN film may be formed with using $C_2H_4$ gas and $N_2$ gas as reaction gas. It is noted that the DLC film and the CN film are transparent or translucent insulating films to visible light. Being transparent to visible light indicates that the film has a transmittance of 80 to 100% for visible light, and being translucent to visible light indicates that the film has a transmittance of 50 to 80% for visible light.

In this embodiment, a protective film is a lamination comprising a first inorganic insulating film, a stress relaxation film, and a second inorganic insulating film. The protective film is formed, for example, according to the following steps; a cathode is formed, the substrate on which the cathode is formed is transported into the deposition chamber 132, and a stress relaxation film (such as a layer containing an organic compound) having hygroscopicity and transparency by vapor deposition, then, the substrate is transported into the deposition chamber 113, and then, a second inorganic insulating layer may be formed.

Next, the substrate on which a light emitting device is formed is transported from the transport chamber 108 into the delivering chamber 111 without exposing to the air, and then transported from the delivering chamber 114 into the sealing chamber 116.

A sealing substrate is set in a load chamber 117 from outside. It is preferable to perform annealing in vacuo in advance in order to remove impurities such as moisture, or the like. In the case of forming a sealing material on the sealing substrate for bonding to the substrate with the EL device, the sealing material is formed in a sealing chamber and the sealing substrate with the sealing material formed is transported into the sealing substrate stock chamber 130. A desiccant may be attached to the sealing substrate in the sealing chamber. Although the example of forming the sealing material on the sealing substrate is shown here, not limited thereto. A sealing material may be formed on the substrate on which EL device is formed.

Next, the substrate and the sealing substrate are bonded each other in the sealing chamber 116 and UV light is irradiated to the pair of bonded substrates with an ultraviolet light irradiation mechanism provided in the sealing chamber 116 to cure the sealing material. Although ultraviolet light curable resin is used as the sealing material here, not limited thereto as long as it is an adhesive.

Then, the pair of substrates bonded is transported from the sealing chamber 116 into the transport chamber 114, and transferred from the transport chamber 114 to the receipt chamber 119, then, the substrate is taken out.

As set forth above, it is possible to fabricate a light emitting device with a high reliability since a light emitting apparatus can be transported without exposing to the air until sealing in an airtight space completely according to the fabrication system shown in FIG. 7. Although the transport chambers 114 and 118 is formed a vacuum and nitride atmosphere alternately, it is preferable to keep constantly vacuum in the transport chamber 102, 104a, and 108. In addition, the transport chamber 118 is formed atmospheric pressure constantly.

It is noted that a controller for an operation in each treatment chamber, transportation the substrate through each treatment chamber, and a pathway for transporting the substrate into each transport chamber for realizing automatic operation is installed with the fabrication system although not shown.

With the fabrication system shown in FIG. 7, it is also possible to form a top emission (or both emission) type light emitting device according to the following steps; the substrate on which a transparent conductive film or a metal film (TiN) is formed as an anode, and a layer containing an organic compound is formed thereon, then, a transparent or translucent cathode (for example, a lamination of a thin metal film such as Al or Ag and a transparent conductive film) is formed. The top emission type light emitting device has the structure wherein light emission generated in the layer containing an organic compound is extracted through the cathode to outside.

With the fabrication system shown in FIG. 7, it is also possible to form a bottom emission type light emitting device according to the following steps; the substrate on which a transparent conductive film is formed as an anode, and a layer containing an organic compound is formed thereon, then, a cathode (Al or Ag) is formed. The bottom emission type light emitting device has the structure wherein light emission generated in the layer containing an organic compound is extracted in the direction from the anode that is a transparent electrode to TFT and the substrate.

This embodiment can be freely combined with any of Embodiment Mode 1 to Embodiment Mode 4.

Embodiment 2

In this embodiment, an example of a multi-chamber type fabrication system that is partly different from that of Embodiment 1 is illustrated in FIG. 8. Specifically, the fabrication system comprises a transport chamber 1004a provided with six film formation chambers 1006R, 1006G, 1006B, 1006R', 1006G', and 1006B'.

In FIG. 8, like components are denoted by like numerals as of FIG. 7 and will be explained no more details.

An example of a system capable of manufacturing full color light emitting devices in parallel is shown in FIG. 8.

Similarly to Embodiment 1, vacuum heating is performed on substrates in the pretreatment chamber 103b, and the substrates are then transported from the transport chamber 102 to the transport chamber 1004a via the delivery chamber 105. Films are laminated on a first substrate through a pathway via the deposition chambers 1006R, 1006G, and 1006B, and films are laminated on a second substrate through a pathway via the deposition chambers 1006R', 1006G', and 1006B'. Throughput can thus be improved by carrying out evaporation on a plurality of substrates in parallel. Subsequent processes may be carried out in accordance with Embodiment 1. A light emitting apparatus can be completed by sealing after cathode formation.

Further, R, G, and B color hole transporting layers, light emitting layers, and electron transporting layers may also be laminated in three different deposition chambers. Note that mask alignment is performed respectively before carrying out evaporation, so that the films are only formed in predetermined regions. It is preferable to use different masks for each of the different colors in order to prevent color mixing, and three masks are necessary in this case. In case of processing plural substrate, for example, the following procedures may be performed. The first substrate is placed in the first deposition chamber, and a layer that contains a red color light emitting organic compound is formed. The first substrate is then removed, and placed next in the second film formation chamber. The second substrate is placed in the first deposition chamber while a layer that contains a green color light emitting organic compound is formed on the first substrate, and a layer that contains the red color light emitting organic compound is formed on the second substrate. The first substrate is lastly placed in the third deposition chamber. The second substrate is placed in the second deposition chamber, and then the third substrate is placed in the first deposition chamber, while a layer that contains a blue color light emitting organic compound is formed on the first substrate. Laminations may thus be performed sequentially.

Further, the R, G, and B color hole transporting layers, light emitting layers, and electron transporting layers may also be laminated in the same deposition chamber. Three type of material layers, corresponding to R, G, and B, may be formed selectively by performing mask positioning through shifting during mask alignment, if the R, G, and B color hole transporting layers, light emitting layers, and electron transporting layers are laminated consecutively in the same film formation chamber. The mask is shared in this case, and only one mask is used.

Further, the substrate and the deposition mask are disposed in a deposition chamber (not shown). Furthermore, the alignment of the deposition mask may be confirmed by using a CCD camera (not shown). Containers in which the evaporation materials are filled are disposed in the evaporation source holders. The deposition chamber is vacuum-evacuated to a degree of vacuum equal to or less than $5 \times 10^{-3}$ Torr (0.665 Pa), preferably from $10^{-6}$ to $10^{-4}$ Pa. Further, the evaporation materials are sublimated (gasified) in advance by resistance heating during evaporation, and scatter in the direction of the substrate by opening the shutter during evaporation. The sublimated evaporation material scatters upward, and is selectively evaporated on the substrate through an opening portion formed in the deposition mask. Note that it is desirable that the film formation speed, the moving speed of the evaporation source holder, and the opening and closing of the shutter be made controllable by a microcomputer. It thus becomes possible to control the evaporation speed by the speed at which the evaporation source holder moves. Further, evaporation can be performed while measuring the film thickness of the evaporation film by using a liquid crystal oscillator provided in the film formation chamber. Changes in the mass of the film evaporated on the liquid crystal oscillator can be measured as changes in resonance frequency for cases where the film thickness of the evaporation film is measured by using the liquid crystal oscillator. In the vapor deposition system, the gap distance d between the substrate and the evaporation source holder during evaporation is shortened to, typically equal to or less than 30 cm, preferably equal to or less than 20 cm, more preferably, from 5 cm to 15 cm. The utilization efficiency and throughput of the evaporation materials is therefore markedly improved. Further, a mechanism capable of moving the evaporation source holder in the X-direction and in the Y-direction in the film formation chamber, with the evaporation source holder maintained in a horizontal orientation, is provided. The evaporation source holder is moved here in a zigzag manner in a two-dimensional surface.

Further, if a hole transporting layer and an electron transporting layer are commonly used, the hole transporting layer is formed first, after which a light emitting layer made from a different material is selectively laminated by using a different mask, and then the electron transporting layer is laminated. Three masks are thus used in this case.

In FIG. 8, four deposition chambers are furnished with the transport chamber so that it is possible to carry out vapor deposition concurrently by transporting the four substrates into each deposition chamber sequentially as shown in FIG. 9A in which an example of a sequence of transporting a substrate into a deposition chamber and transporting the substrate from the deposition chamber is illustrated.

Although the number of processable substrate is decreased, for example, the deposition can be carried out in the first deposition chamber to the third deposition chamber sequentially without suspending production lines even during maintenance of the fourth deposition chamber as shown in FIG. 9B.

This embodiment can be freely combined with Embodiment Mode 1 to 4, or Embodiment 1.

Embodiment 3

Figure 13A:
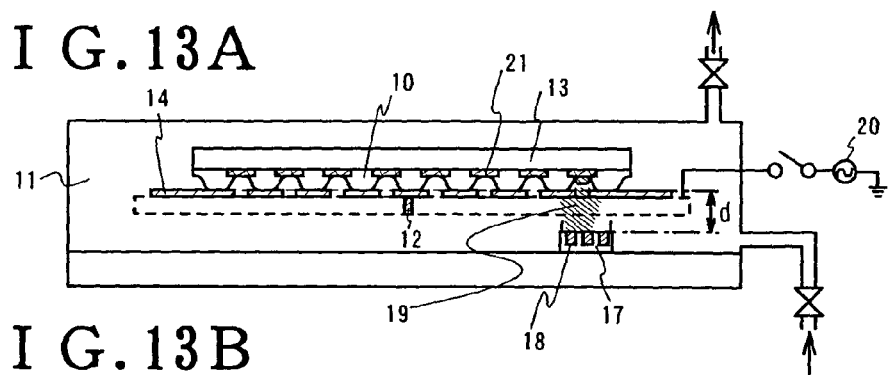
FIG. 13A and FIG. 13B are a cross sectional view in the X-direction and a top view of a fabricating system, respectively. (Embodiment 3)
Figure 13B:
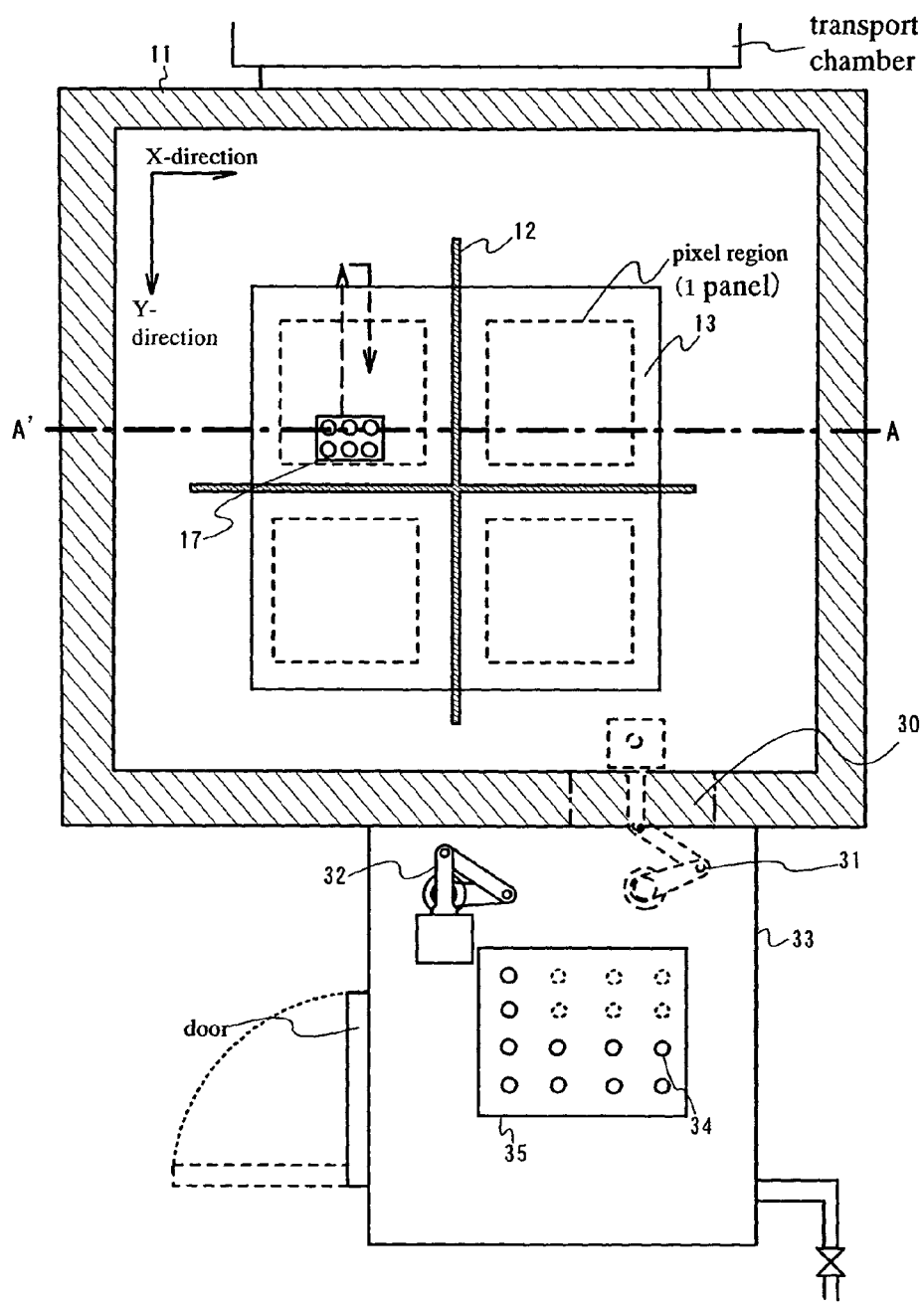

FIGS. 13A and 13B show a vapor deposition system according to the invention. FIG. 13A is a cross sectional view in X-direction (taken along a dotted line A-A') and FIG. 13B is a top view. Further, FIG. 13A and FIG. 13B show the vapor deposition system in the midst of vapor deposition.

In FIG. 13B, a deposition chamber 11 includes a substrate holding means 12, an evaporation source holder 17 installed with six crucibles, a moving mechanism for the evaporation source holder (not shown), and means of producing a low pressure atmosphere. Further, the deposition chamber 11 is installed with a substrate 13 and a deposition mask 14. An installation chamber 13 is coupled with the deposition chamber 11 via a shutter 30. The installation chamber 11 comprises a transport mechanism 31 for transporting a first container (crucible) 34 into an evaporation holder, a turntable 35 on which the first container (crucible) is placed, and a hauling mechanism 32 for hauling a second container that sealed the first container therein.

Further, the substrate holding means 12 fixes by gravitation the deposition mask 14 made of a metal and therefore fixes the substrate 13 which is arranged over the deposition mask. Note that a vacuum suction mechanism may be installed with the substrate holding means 12 for fixing the mask. Although an example of bringing the deposition mask into close contact with the substrate holding means 12 is shown here, in order to prevent the deposition mask and the substrate holding means from fixing each other, an insulator may be provided in the intersection portion of the deposition mask and the substrate holding means each other, or a shape of the substrate holding means may be arbitrarily changed so as to be in point contact with the deposition mask. Further, although an example of installing both the substrate and the deposition mask by means of the substrate holding means 12 is shown here, a means of holding the substrate and another means of holding the deposition mask may be individually provided.

Further, it is preferable that the substrate holding means 12 be formed in a cutting region (a region to be a scribe line) when a multiple pattern is executed because deposition cannot be carried out in a region that is overlapping with the substrate holding means 12. Or, the substrate holding means 12 may be formed so as to overlap with a region to be a panel terminal portion. As shown in FIG. 13B, the substrate holding means 12 is formed in the shape of a cross as seen from the upper surface since FIG. 13B shows an example of forming four panels that are drawn in a dotted line within one substrate 13. However, the shape of the substrate holding means 12 is not limited to this structure, an asymmetry shape may be acceptable. Incidentally, not shown in the figure, the substrate holding means 12 is fixed in the deposition chamber. Note that masks are not shown in FIG. 13B for simplification.

Further, alignments of the deposition mask and the substrate may be confirmed by using a CCD camera (not shown). The alignment control may be carried out by installing alignment markers to the substrate and deposition mask respectively. The evaporation source holder 17 is installed with a vessel filled with an evaporation material 18.

The deposition chamber 11 is vacuumed to a vacuum degree of $5 \times 10^{-3}$ Torr (0.665 Pa) or lower, preferably, $10^{-4}$ through $10^{-6}$ Pa by the means of producing the low pressure atmosphere.

Further, the evaporation material is previously sublimated (vaporized) by resistance heating and scattered in the direction of the substrate 13 by opening the shutter (not shown) during deposition. An evaporated evaporation material 19 is scattered in an upward direction and is selectively deposited on the substrate 13 by passing an opening portion provided at the deposition mask 14. Further, preferably, the deposition rate, a moving speed of the evaporation source holder and opening and closing of the shutter are controlled by a microcomputer. The deposition rate of the evaporation source holder can be controlled by the moving speed.

Further, although not illustrated, deposition can be carried out while measuring the film thickness of a vapor deposited film by quartz oscillator provided at the deposition chamber 11. When the film thickness of the vapor deposited film is measured by using the quartz oscillator, a change in mass of a film deposited to the quartz oscillator can be measured as a change in the resonance frequency.

In the vapor deposition system shown in FIG. 13A and FIG. 13B, during the vapor deposition, a distance d of an interval between the substrate 13 and the evaporation source holder 17 can be reduced to, typically, 30 cm or less, preferably, 20 cm or less, further preferably, from 5 cm to 15 cm to thereby significantly promote an efficiency of the evaporation material and throughput.

In the vapor deposition system, the evaporation source holder 17 comprises a container (typically a crucible); a heater set outside of the container via a soaking member; a heat insulating layer set outside of the heater; an outer casing storing these; a cooling pipe rounded around the outside of the outer casing; an evaporation shutter that opens and closes an opening portion of the outer casing including an opening portion of a crucible. Further, the evaporation source holder may be a container capable of being carried in a state of fixing the heater to the container. Further, the container is made from a material of a sintered body of BN, a composite sintered body of BN and AlN, quartz or a graphite capable of withstanding high temperature, high pressure and low pressure.

Further, the evaporation source holder 17 is provided with a mechanism movable in X-direction or Y-direction at inside of the deposition chamber 11 while being kept horizontal. In this case, the evaporation source holder 17 is made to move in zigzag on a two-dimensional surface as shown by FIG. 13B. Further, a pitch of moving the evaporation source holder 17 may be appropriately matched to an interval between insulators.

It is preferable that deposits attached to a mask is vaporized to be evacuated to outside of a deposition chamber for cleaning the deposits attached to the mask by generating plasma in the deposition chamber by means of plasma generation. A high frequency power source is connected to the substrate holding means 12. Thus, it is preferable that the substrate holding means 12 is made from a conductive material (such as Ti). In case of generating plasma, it is preferable to space a metal mask from the substrate holding means 12 electrically for preventing electric field concentration.

By using the deposition chamber that has a mechanism for transporting an evaporation holder, it is not needed to increase the distance between a substrate and the evaporation holder, and so a vapor deposited film can be uniformly formed.

According to the present invention, the distance between a substrate and an evaporation holder can be reduced, and miniaturization of a vapor deposition system can be achieved. Further, the vapor deposition system becomes small, and therefore the adhesion of sublimated evaporation materials on interior walls within the deposition chambers, or on evaporation preventing shields can be reduced. The evaporation materials can thus be utilized without waste. In addition, it is not necessary to rotate the substrates in the evaporation method of the present invention, and therefore a vapor deposition system capable of handling large surface area substrates can be provided.

By reducing the distance between a substrate and an evaporation holder, a vapor deposited film can be formed under well controlled.

This embodiment can be freely combined with Embodiment Mode 1 to 4, Embodiment 1, or Embodiment 2.

Embodiment 4

In this embodiment, described is an example of a device having respective functions of a plurality of various types of materials as well as enhancing mobility of a carrier by relaxing an energy barrier in an organic compound film and performing division of functions of a lamination structure In regard to relaxation of the energy barrier in the lamination structure, a technique of inserting a carrier injection layer is well referred to. That is, by inserting a material that relaxes the energy barrier present in an interface of the lamination structure having a large energy barrier into the interface, a design can be made such that the energy barrier is set in a stepwise pattern. By making such design, a property of a carrier injection from the electrode can be enhanced to surely reduce a drive voltage to certain extent. However, there is a problem in that, by increasing the number of layers, the number of organic interfaces is increased as well. It is considered that such feature is the reason why a single layer structure rather holds top data of drive voltage/power efficiency. In other words, by overcoming the problem, the lamination structure can reach the drive voltage/power efficiency of the single layer structure, while maintaining a merit (capability of combinations of various types of materials free from necessity of a complicated design of molecules) of the lamination structure.

In this embodiment, when an organic compound film comprising a plurality of functional regions is formed between a cathode and an anode of a light emitting apparatus, a structure having a mixed region, which is different from a conventional lamination structure in which a distinct interface is present, comprising simultaneously a material which constitutes a first functional region and another material which constitutes a second functional region is formed between the first functional region and the second functional region.

This embodiment also includes the case where a material that is capable of converting triplet excitation energy into light emission is added to the mixed region as a dopant. In addition to the formation of the mixed region, the mixed region may be formed to have a concentration gradient.

It is considered that, by applying such structure as described above, the energy barrier which is present between functional regions is reduced compared with the conventional structure, thereby enhancing the carrier injection property. That is, the energy barrier between functional regions is relaxed by forming the mixed region and, accordingly, prevention of reduction of drive voltage and luminance can be realized.

Therefore, in this embodiment, when a light emitting device comprising at least a region (referred to as a first functional region) in which a first organic compound can exhibit a function thereof and another region (referred to as a second functional region) in which a second organic compound, being different from a substance which constitutes the first functional region, can exhibit a function thereof, and a light emitting device comprising such light emitting device are manufactured, a mixed region, containing the organic compound which constitutes the first functional region and another organic compound which constitutes the second functional region, is prepared between the first functional region and the second functional region.

A film formation system is configured such that an organic compound film having a plurality of functional regions can be formed in one deposition chamber, and a plurality of evaporation sources are provided in correspondence with such plurality of functional regions.

Firstly, a first organic compound is vapor deposited. The first organic compound, which has previously been vaporized by resistance heating, is scattered in the direction of the substrate by opening a shutter at the time of vapor deposition and, accordingly, a first functional region 610 as shown in FIG. 14A can be formed.

Next, while keeping a state in which the first organic compound is vapor deposited, a first shutter is opened and, then, a second organic compound is vapor deposited. Further, the second organic compound which has also previously been vaporized by resistance heating is scattered in the direction of the substrate by opening a second shutter at the time of vapor deposition and, accordingly, a first mixed region 611 comprising the first organic compound and the second organic compound can be formed.

Then, after a while, only the first shutter is closed to allow the second organic compound to be vapor deposited and, accordingly, a second functional region 612 can also be formed.

Further, in this embodiment, a case in which the mixed region is formed by allowing two types of organic compounds to be simultaneously vapor deposited is described. However, it is also possible that the first organic compound is first vapor deposited and, then, a mixed region is formed between the first functional region and the second functional region by allowing the second organic compound to be vapor deposited in an atmosphere of such vapor deposition of the first organic compound.

Subsequently, while keeping a state in which the second organic compound is vapor deposited, a third shutter is opened and, then, a third organic compound is vapor deposited. Further, the third organic compound, which has also previously been vaporized by resistance heating, is scattered in the direction of the substrate by opening the shutter at the time of vapor deposition and, accordingly, a second mixed region 613 comprising the second organic compound and the third organic compound can be formed.

Then, after a while, only the second shutter is closed to allow the third organic compound to be vapor deposited and, accordingly, a third functional region 614 can also be formed.

Finally, a light emitting device is completed by forming a cathode on the resultant substrate.

Further, as for another organic compound films as shown in FIG. 8B, after a first functional region 620 is formed by using the first organic compound, a first mixed region 621 comprising the first organic compound and the second organic compound is formed and, then, a second functional region 622 is formed by using the second organic compound. Thereafter, in the process of forming the second functional region 622, the third shutter is temporarily opened to simultaneously vapor deposit a third organic compound, and thereby a second mixed region 623 is formed.

Then, after a while, the second functional region 622 is formed again by closing the third shutter. Thereafter, a cathode is formed on the resultant substrate, thereby fabricating a light emitting device.

Since an organic compound film having a plurality of functional regions can be formed in one deposition chamber, a functional region interface is not contaminated by impurities and, also, a mixed region can be formed in a functional region interface. Therefore, a light emitting device having a plurality of functions can be fabricated without having distinct lamination structure (namely, without a distinct organic interface).

Further, when the film formation system which can perform vacuum annealing before, while, or after a film-forming operation is executed is employed, a more fitting intermolecular state in the mixed region can be established by performing vacuum annealing while the film-forming operation is executed. Accordingly, it becomes possible to prevent the drive voltage and luminance from being reduced. Further, impurities, such as oxygen and moisture, in the organic compound layer that has been formed on the substrate are further removed by performing such annealing (evacuation) operation after the film is formed, and thereby the organic compound layer having high density and high purity can be formed.

Further, this embodiment can freely be combined with any one of Embodiment Modes 1 to 4 and Embodiments 1 to 3.

Embodiment 5

In FIG. 15A, shown is an example of fabricating a light emitting device (having an top emission structure) provided on a substrate having an insulating surface with a light emitting device in which an organic compound layer is allowed to be a light emitting layer.

FIG. 15A is a top view of the light emitting device, while FIG. 15B is a cross-sectional view taken along a line A-A' in FIG. 15A. Reference numeral 1101 indicated by a dotted line denotes a source signal line driver circuit; reference numeral 1102 denotes a pixel portion; and reference numeral 1103 denotes a gate signal line driver circuit. Further, reference numeral 1104 denotes a transparent sealing substrate; reference numeral 1105 denotes a first sealing material; and reference numeral 1107 denotes a transparent second sealing material which fills an inside of an area surrounded by the first sealing material 1105. The first sealing material 1105 contains a gap material for securing a space between substrates.

Reference number 1108 denotes a wiring for transmitting a signal to be inputted to the source signal line driver circuit 1101 and the gate signal line driver circuit 1103. The wiring 1108 receives a video signal or a clock signal from a flexible print circuit (FPC) 1109 which becomes an external input terminal. Although only the FPC 1109 is shown, a printed wiring board (PWB) may be attached to the FPC 1109.

Subsequently, a cross sectional structure will be described with reference to FIG. 15B. A driver circuit and a pixel portion are formed on a substrate 1110, but the source signal line driver circuit 1101 as the driver circuit and the pixel portion 1102 are shown in FIG. 15B.

In the source signal line driver circuit 1101, a CMOS circuit in which an n-channel type TFT 1123 and a p-channel type TFT 1124 are combined is formed. The TFT that constitutes the driver circuit may be formed by CMOS circuit, a PMOS circuit or an NMOS circuit that are known in the art. In this embodiment, a driver-integrated type in which the driver circuit is formed on the substrate is shown, but the driver-integrated type may not necessarily be adopted. The driver circuit can also be formed outside instead of being formed on the substrate. A structure of the TFT using a polysilicon film as an active layer is not particularly limited, therefore the structure may be either a structure of a top gate type TFT or a structure of a bottom gate type TFT.

The pixel portion 1102 is formed with a plurality of pixels including a switching TFT 1111, a current-controlling TFT 1112 and a first electrode (anode) 1113 that is electrically connected to a drain of the current-controlling TFT 1112. The current-controlling TFT 1112 may either be an n-channel type TFT or a p-channel type TFT, but when it is connected to the anode, it is preferably the p-channel type TFT. It is also preferable that a storage capacitor (not shown) is appropriately provided. An example in which only a cross-cross sectional structure of one pixel is shown whereupon two TFTs are used in the pixel is illustrated, but three or more TFTs may appropriately be used per pixel.

Since it is constituted such that the first electrode 1113 is directly connected to the drain of the TFT, it is preferable that a lower layer of the first electrode 1113 is allowed to be a material layer which can have an ohmic contact with the drain comprising silicon while an uppermost layer thereof which contacts a layer containing an organic compound is allowed to be a material layer which has a large work function. For example, a three-layer structure made of a titanium nitride film, a film containing aluminum as a primary component, and a titanium nitride film, can have a low resistance of wiring, and a favorable ohmic contact and, also, can function as an anode. Further, as the first electrode 1113, a single layer of a titanium nitride film, a chromium film, a tungsten film, a zinc film, a platinum film or the like, or a laminated layer of three layers or more may be used.

An insulating substance 1114 (referred to as a bank, a partition, a barrier, a mound or the like) is formed on each end of the first electrode (anode) 1113. The insulating substance 1114 may be formed by either an organic resin film or an insulating film comprising silicon. In this embodiment, as for the insulating substance 1114, an insulating substance is formed in a shape as shown in FIG. 15B by using a positive type photosensitive acrylic resin film.

For the purpose of enhancing a coverage effect, a curved surface having a curvature is formed in an upper end portion or a lower end portion of the insulating substance 1114. For example, when the positive type photosensitive acrylic resin is used as a material for the insulating substance 1114, it is preferable that a curved surface having a curvature radius (0.2 mm to 3 mm) is provided only to the upper end portion of the insulating substance 1114. As for the insulating substance 1114, either one of a negative type which becomes insoluble to an etchant by photosensitive light, and a positive type which becomes soluble to the etchant by light can be used.

Further, the insulating substance 1114 may be covered with a protective film comprising an aluminum nitride film, an aluminum oxynitride film, a thin film containing carbon as a primary component or a silicon nitride film.

A layer 1115 containing an organic compound is selectively formed on the first electrode (anode) 1113 by a vapor deposition method using a deposition mask or an ink-jet method. Further, a second electrode (cathode) 1116 is formed on the layer 1115 containing the organic compound. As the cathode, a material having a small work function (for example Al, Ag, Li, Ca, alloys of thereof, that is, MgAg, MgIn, AlLi, CaF2, or CaN) may be used. In this embodiment, a laminated layer of a metal thin film that is thin in thickness and a transparent conductive film (for example, an indium oxide-tin oxide alloy (ITO), an indium oxide-zinc oxide alloy ($In_2O_3$—ZnO), or zinc oxide (ZnO)) is used as the second electrode (cathode) 1116 so that luminescence can pass through the layer. A light emitting device 1118 comprising the first electrode (anode) 1113, the layer 1115 containing the organic compound, and the second electrode (cathode) 1116 is thus fabricated. In this embodiment, the light emitting device 1118 is an example of emitting white light whereupon a color filter (for the purpose of simplicity, an overcoat layer is not shown) comprising a colored layer 1131 and a light blocking layer (BM) 1132 is provided.

Further, when layers each containing an organic compound which can obtain R, G, and B luminescence, respectively, are selectively formed, a full-color display can be obtained without using a color filter.

A transparent protective layer 1117 is formed in order to seal the light emitting device 1118. As for the transparent protective layer 1117, the transparent protective laminated layer shown in Embodiment Mode 1 can be adopted. The transparent protective laminated layer comprises a laminated layer comprising a first inorganic insulating film, a stress relaxation film and a second inorganic insulating film. As the first inorganic insulating films and the second inorganic insulating film, a silicon nitride film, silicon oxide film, a silicon oxynitride film (SiNO film (component ratio: N>O), or SiON film (component ratio: N<O)), or a thin film containing carbon as a primary component (e.g., DLC film, or CN film) which are obtained by a sputtering method or a CVD method can be used. These inorganic insulating films each have a high blocking effect against moisture; however, as film thickness thereof is increased, a film stress is increased, as a result, a partial of the film is easily peeled or a whole thereof is easily removed. Nevertheless, stress can be relaxed and, also, moisture can be absorbed by sandwiching the stress relaxation film between the first inorganic insulating film and the second inorganic insulating film. Even when a minute hole (pinhole or the like) is formed in the first inorganic insulating film by an undefined reason, the minute hole can be filled by the stress relaxation film and, further, by providing the second inorganic insulating film thereon, an extremely high blocking effect against moisture or oxygen can be attained. As for materials for the stress relaxation film, a material which has smaller stress than the inorganic insulating films and has a hygroscopic property is preferable and, a material having a translucent property in addition to the above-described properties is desirable. Further, as for the stress relaxation film, a material film containing an organic compound such as α-NPD (4,4'-bis[N-(naphthyl)-N-phenyl-amino]biphenyl), BCP (bathocuproin), MTDATA (4,4',4"-tris(N-3-methylphenyl-N-phenyl-amino) triphenylamine, and $Alq_3$ (a tris-8-quinolinolate aluminum complex) may be used. These material films each have a hygroscopic property whereupon, when they become thin in thickness, they become nearly transparent. Since MgO, $SrO_2$, and SrO each have a hygroscopic property and translucency and can be made into a thin film by a vapor deposition method, any one of these oxides can be used as the stress relaxation film. In this embodiment, using a silicon target, a film formed in an atmosphere containing a nitrogen gas and an argon gas, that is, a silicon nitride film having a high blocking effect against impurities such as moisture and an alkali metal is used as the first inorganic insulating film or the second inorganic insulating film, and a thin film of $Alq_3$ formed by a vapor deposition method is used as the stress relaxation film. Further, in order to allow luminescence to penetrate the transparent protective laminated layer, it is preferable that an entire film thickness of the transparent protective laminated layer is formed as thin as possible.

Further, in order to seal the light emitting device 1118, the sealing substrate 1104 is bonded thereto by using the first sealing material 1105 and the second sealing material 1107 in an inert gas atmosphere. As for the first sealing material 1105 and the second sealing material 1107, it is preferable that an epoxy resin is used. It is also preferable that the first sealing material and the second sealing material are each made of a material which allows moisture or oxygen to penetrate thereinto as little as possible.

Further, in this embodiment, a plastic substrate made of fiberglass-reinforced plastics (FRP), polyvinylfluoride (PVF), Mylar, polyester, an acrylic resin, or the like, in addition to a glass substrate or a quartz substrate can be used as a material which constitutes the sealing substrate 1104. After the sealing substrate 1104 was bonded using the first sealing material 1105 and the second sealing material 1107, it is possible to perform sealing by a third sealing material so that a side face (exposed face) is covered.

By sealing the light emitting device by the transparent protective layer 1117, the first sealing material 1105, and the second sealing material 1107 in a manner as described above, the light emitting device can thoroughly be shielded from outside, and thereby a substance, such as moisture and oxygen, which deteriorates the organic compound layer can be prevented from entering from outside. Accordingly, a light emitting device having high reliability can be obtained.

Further, as for the first electrode 1113, a both top and bottom emission type light emitting apparatus can be prepared by using a transparent conductive film.

In this embodiment, an example of a structure (hereinafter referred to as "top emission structure") in which a layer containing an organic compound is formed on an anode and a cathode which is a transparent electrode is formed on the layer containing an organic compound, is described above. On the other hand, a structure having a light emitting device (hereinafter referred to as "bottom emission structure") in which a layer containing an organic compound is formed on an anode and a cathode is formed on the organic compound layer and allowing luminescence generated in a layer containing the organic compound to emit from the anode, which is the transparent, electrode toward TFT may also be adopted.

An example of a light emitting apparatus having a bottom emission structure is shown in FIG. 16A and FIG. 16B.

FIG. 16A is a top view of the light emitting apparatus, while FIG. 16B is a cross-sectional view taken along a line A-A' in FIG. 16A. Reference numeral 1201 indicated by a dotted line denotes a source signal line driver circuit; reference numeral 1202 denotes a pixel portion; and reference numeral 1203 denotes a gate signal line driver circuit. Further, reference numeral 1204 denotes a sealing substrate; reference numeral 1205 denotes a sealing material in which a gap material for securing a sealed space is contained; and an inside of an area surrounded by the sealing material 1205 is filled with an inert gas (typically, a nitrogen gas). A trace quantity of moisture present in the space inside the area surrounded by the sealing material 1205 is removed by a desiccant 1207 and, accordingly, the space is sufficiently dry.

Reference number 1208 denotes a wiring for transmitting a signal to be inputted to the source signal line driver circuit 1201 and the gate signal line driver circuit 1203. The wiring 1208 receives a video signal or a clock signal from a flexible print circuit (FPC) 1209 which becomes an external input terminal.

Subsequently, a cross sectional structure will be described with reference to FIG. 16B. A driver circuit and a pixel portion are formed over a substrate 1210, but the source signal line driver circuit 1201 as the driver circuit and the pixel portion 1202 are shown in FIG. 16B. In the source signal line driver circuit 1201, a CMOS circuit in which an n-channel type TFT 1223 and a p-channel type TFT 1224 are combined is formed.

The pixel portion 1202 is formed with a plurality of pixels including a switching TFT 1211, a current-controlling TFT 1212 and a first electrode (anode) comprising a transparent conductive film 1213 that is electrically connected to a drain of the current-controlling TFT 1212.

In this embodiment, arranged is a structure in which the first electrode 1213 is formed such that a part thereof is overlapped with a connecting electrode and the first electrode 1213 is electrically connected to a drain region of TFT via a connecting electrode. It is preferable that the first electrode 1213 has transparency and comprises an electrically conductive film having a large work function (for example, an indium oxide-tin oxide alloy (ITO), an indium oxide-zinc oxide alloy ($In_2O_3$—ZnO), or zinc oxide (ZnO)).

An insulating substance 1214 (referred to as a bank, a partition, a barrier, a mound or the like) is formed on each end of the first electrode (anode) 1213. For the purpose of enhancing a coverage effect, a curved surface having a curvature is formed in an upper end portion or a lower end portion of the insulating substance 1214. Further, the insulating substance 1214 may be covered with a protective film comprising an aluminum nitride film, an aluminum oxynitride film, a thin film containing carbon as a primary component or a silicon nitride film.

A layer 1215 containing an organic compound is selectively formed on the first electrode (anode) 1213 by a vapor deposition method using a deposition mask or an ink-jet method. Further, a second electrode (cathode) 1216 is formed on the layer 1215 containing the organic compound. As for the cathode, a material having a small work function (for example Al, Ag, Li, Ca, alloys of thereof, that is, MgAg, MgIn, AlLi, $CaF_2$, or CaN) may be used. In such a manner as described above, a light emitting device 1218 comprising the first electrode (anode) 1213, the layer 1215 containing the organic compound, and the second electrode (cathode) 1216 is fabricated. The light emitting device 1218 emits light in a direction which an arrow in FIG. 16B indicates. The light emitting device 1218 in this embodiment is one type of light emitting devices which can obtain mono-color luminescence of R, G, or B. Three light emitting devices in which a layer containing an organic compound that is capable of obtaining R, G, or B luminescence is selectively formed are combined to obtain full-color luminescence.

Further, a protective layer 1217 is formed in order to seal the light emitting device 1218. As for the protective layer 1217, the protective laminate shown in Embodiment Mode 2 can be adopted. The protective laminate comprises a laminate comprising a first inorganic insulating film, a stress relaxation film and a second inorganic insulating film.

Further, in order to seal the light emitting device 1218, the sealing substrate 1204 is bonded thereto by using the sealing material 1205 in an inert gas atmosphere. A recess portion has previously been formed on the sealing substrate 1204 by a sand-blast method or the like and, then, a desiccant 1207 is bonded to the thus-formed recess portion. As for the sealing material 1205, it is preferable that an epoxy resin is used. It is also preferable that the sealing material 1205 is made of a material that allows moisture or oxygen to penetrate thereinto as little as possible.

Further, in this embodiment, a plastic substrate made of fiberglass-reinforced plastics (FRP), polyvinyl fluoride (PVF), Mylar, polyester, an acrylic resin or the like, in addition to a metal substrate, a glass substrate or a quartz substrate can be used as a material which constitutes the sealing substrate 1204 having the recess portion. It is also possible to perform sealing by using a metal can in which a desiccant is bonded to the inside thereof.

Further, this embodiment can freely be combined with any one of Embodiment Modes 1 to 4 and Embodiments 1 to 4.

Embodiment 6

Various modules (active matrix liquid crystal module, active matrix EL module and active matrix EC module) can be completed by implementing the present invention. Thus, all electronic appliances incorporated these modules into display portions can be completed.

Such electronic appliances are as follows: video cameras, digital cameras, head mounted displays (goggle type displays), car navigation systems, projectors, car stereos, personal computers, portable information terminals (mobile computers, mobile phones or electronic books etc.) etc. Practical examples thereof are shown in FIGS. 17A to 18C.

Figure 17A:
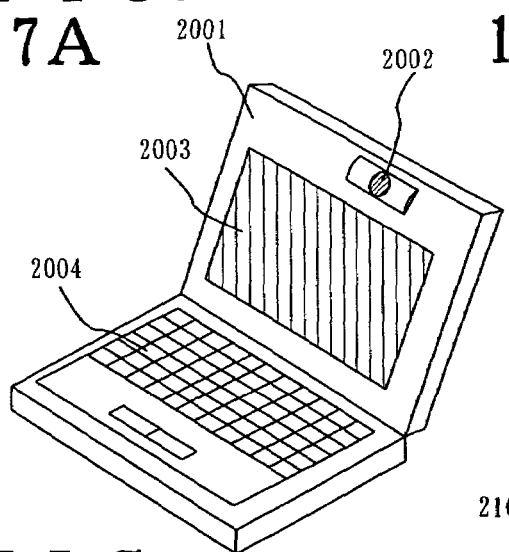
FIG. 17A to 17E show examples of electronic appliances. (Embodiment 6)

FIG. 17A is a personal computer which comprises a main body 2001, an image input section 2002, a display portion 2003, a keyboard 2004 and the like.

Figure 17B:
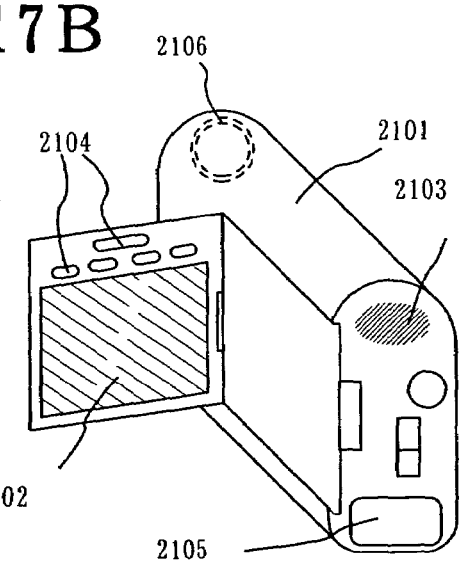

FIG. 17B is a video camera which comprises a main body 2101, a display portion 2102 a voice input section 2103, operation switches 2104, a battery 2105, an image receiving section 2106 and the like.

Figure 17C:
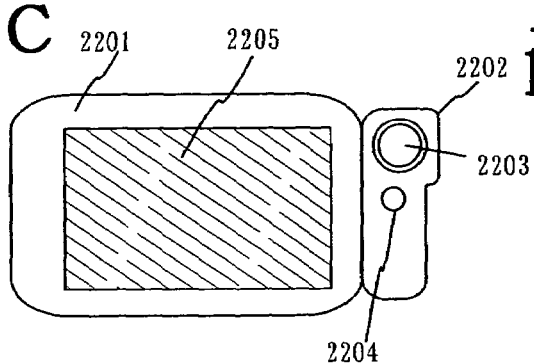

FIG. 17C is a mobile computer which comprises a main body 2201, a camera portion 2202, an image receiving section 2203, an operation switch 2204, a display portion 2205 and the like.

Figure 17D:
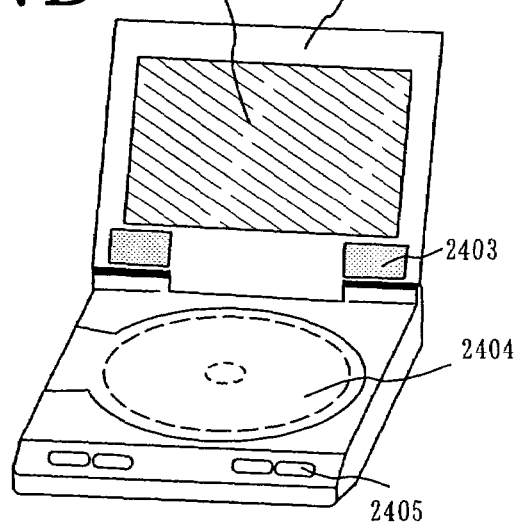

FIG. 17D is a player using a recording medium which records a program (hereinafter, referred to as a recording medium), including a main body 2401, a display portion 2402, a speaker portion 2403, a recording medium 2404, an operation switch 2405 and the like. In addition, the player using a DVD (Digital Versatile Disc), a CD or the like as a recording medium can be used for enjoying music, cinema, game, Internet or the like.

Figure 17E:
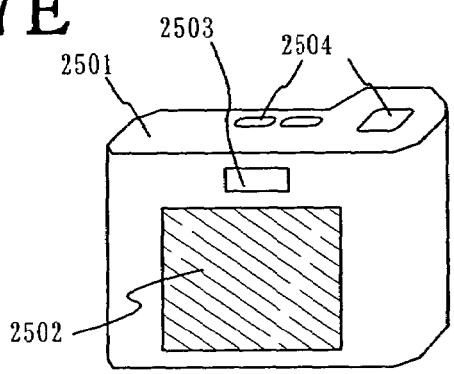

FIG. 17E is a digital camera which comprises a main body 2501, a display portion 2502, a view finder 2503, operation switches 2504, and an image receiving section (not shown in the figure) etc.

Figure 18A:
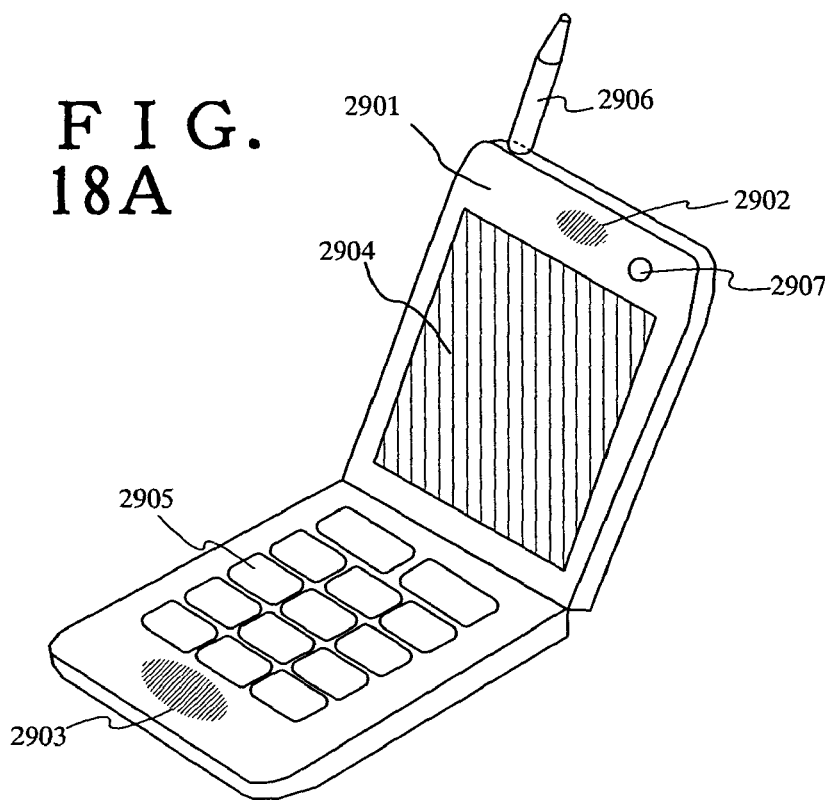
FIG. 18A to 18C show examples of electronic appliances. (Embodiment 6)

FIG. 18A is a mobile phone which comprises a main body 2901, a voice output section 2902, a voice input section 2903, a display portion 2904, operation switches 2905, an antenna 2906, an image input section (CCD, image sensor, etc.) 2907 and the like.

Figure 18B:
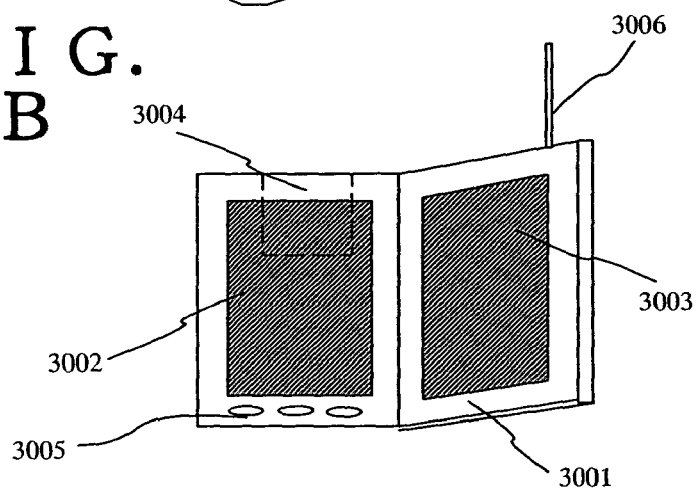

FIG. 18B is a portable book (electronic book) which comprises a main body 3001, display portions 3002 and 3003, a recording medium 3004, operation switches 3005, an antenna 3006 and the like.

Figure 18C:
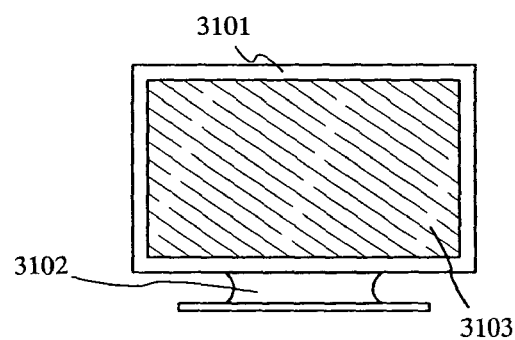

FIG. 18C is a display unit which comprises a main body 3101, a supporting portion 3102, a display portion 3103 and the like.

In addition, the display portion shown in FIG. 18C is small, medium or large size display portion, for example a size of 5 to 20 inches. Further, in manufacturing the displays portion with such sizes, it is preferable to use a substrate with one meter on a side to mass-produce display portions.

As described above, the applicable range of the present invention is so wide that the invention can be applied to electronic appliances of various fields. Note that the electronic appliances of this embodiment can be achieved by utilizing any combination of constitutions in Embodiment Mode 1 to 4 and Embodiment 1 to 5.

Embodiment 7

The electronic appliances represented in Embodiment Mode 6 includes a panel in which light emitting device is sealed and a module in which the panel is provided with a controller and an IC including a circuit such as a power supply circuit. The module and the panel are both corresponding to one mode of the light-emitting apparatus. In the present invention, a specific configuration of the module will be described.

Figure 19A:
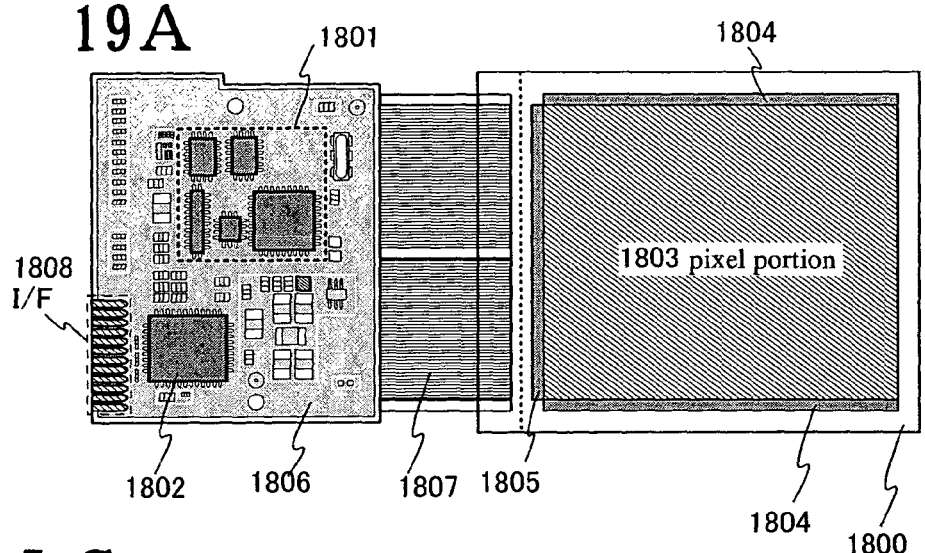
FIG. 19A and FIG. 19B are views showing a module.

FIG. 19A shows an appearance of a module in which a panel 1800 is provided with a controller 1801 and a power supply circuit 1802. The panel 1800 is provided with a pixel portion 1803 in which a light emitting device is provided in each pixel, a gate line driver circuit 1804 for selecting a pixel in the pixel portion 1803, and a source line driver circuit 1805 for supplying a video signal to the selected pixel.

The controller 1801 and the power supply circuit 1802 are provided in a printed substrate 1806, various kinds of signals and power supply voltage output from the controller 1801 or the power supply circuit 1802 are supplied via FPC 1807 to the pixel portion 1803, the gate line driver circuit 1804, and the source line driver circuit 1805 in the panel 1800.

The power supply voltage and the various kind of signals are supplied to the printed circuit 1806 via an interface (I/F) 1808 in which a plurality of input terminals are arranged.

Although the printed substrate 1806 is mounted on the panel 1800 with FPC in this embodiment, the present invention is not limited to this configuration. The controller 1801 and the power supply circuit 1802 may be provided directly on the panel 1800 with COG (Chip on Class) method.

Further, in the printed circuit 1806, there is a case that a capacitance formed between leading wirings and a resistance of a wiring itself cause a noise to a power supply voltage or a signal, or make a rise of a signal dull. Therefore, it may be provide various kinds of devices such as a capacitor and a buffer to prevent the noise to the power supply voltage or a signal and the dull rise of the signal in the printed substrate 1806.

Figure 19B:
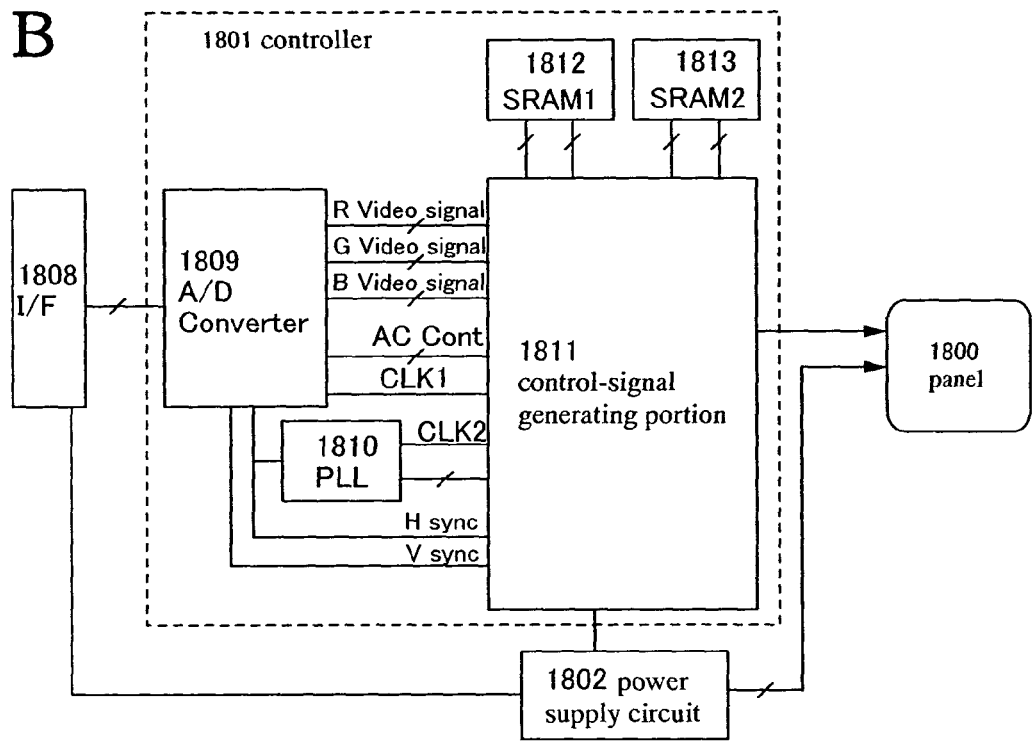

FIG. 19B is a block diagram showing a configuration of the printed substrate 1806. Various kinds of signals and power supply voltage supplied to the interface 1808 are supplied to the controller 1801 and the power supply circuit 1802.

The controller 1801 has an A/D converter 1809, a phase locked loop (PLL) 1810, control-signal generating portion 1811, and SRAMs (Static Random Access Memory) 1812 and 1813. Although the SRAM is used in this embodiment, instead of the SRAM, SDRAM can be used and DRAM (Dynamic Random Access Memory) can also be used if it is possible to write in and read out data at high speed.

Video signals supplied via the interface 1808 are subjected to a parallel-serial conversion in the A/D converter 1809 to be input into the control-signal generating portion 1811 as video signals corresponding to respective colors of R, G, and B. Further, based on various kinds of signals supplied via the interface 1808, Hsync signal, Vsync signal, clock signal CLK, and volts alternating current (AC cont) are generated in the A/D converter 1809 to be input into the control signal generating portion 1811.

The phase-locked loop 1810 has a function to synchronize the phase of the frequency of each signal supplied through the interface 1808 with the phase of the operating frequency of the control-signal generating portion 1811. The operating frequency of the control-signal generating portion 1811 is not necessarily the same as the frequency of each signal supplied through the interface 1808, but adjust, in the phase-locked loop 1810, the operating frequency of the control-signal generating portion 1811 in a manner of synchronization with one another.

The video signal inputted to the control-signal generating portion 1811 is once written into and held on the SRAM 1812, 1813. The control-signal generating portion 1811 reads out the video signals corresponding to all the pixels, one bit by one bit, from among all the bits of video signals held on the SRAM 1812, and supplies them to the source line driver circuit 1805 in the panel 1800.

The control-signal generating portion 1811 supplies the information concerning a period during which the light emitting device of each bit causes light emission, to the scanning-line driver circuit 1804 in the panel 1800.

The power supply circuit 1802 supplies a predetermined power supply voltage to the source line driver circuit 1805, scanning-line driver circuit 1804 and pixel portion 1803 in the panel 1800.

Figure 20:
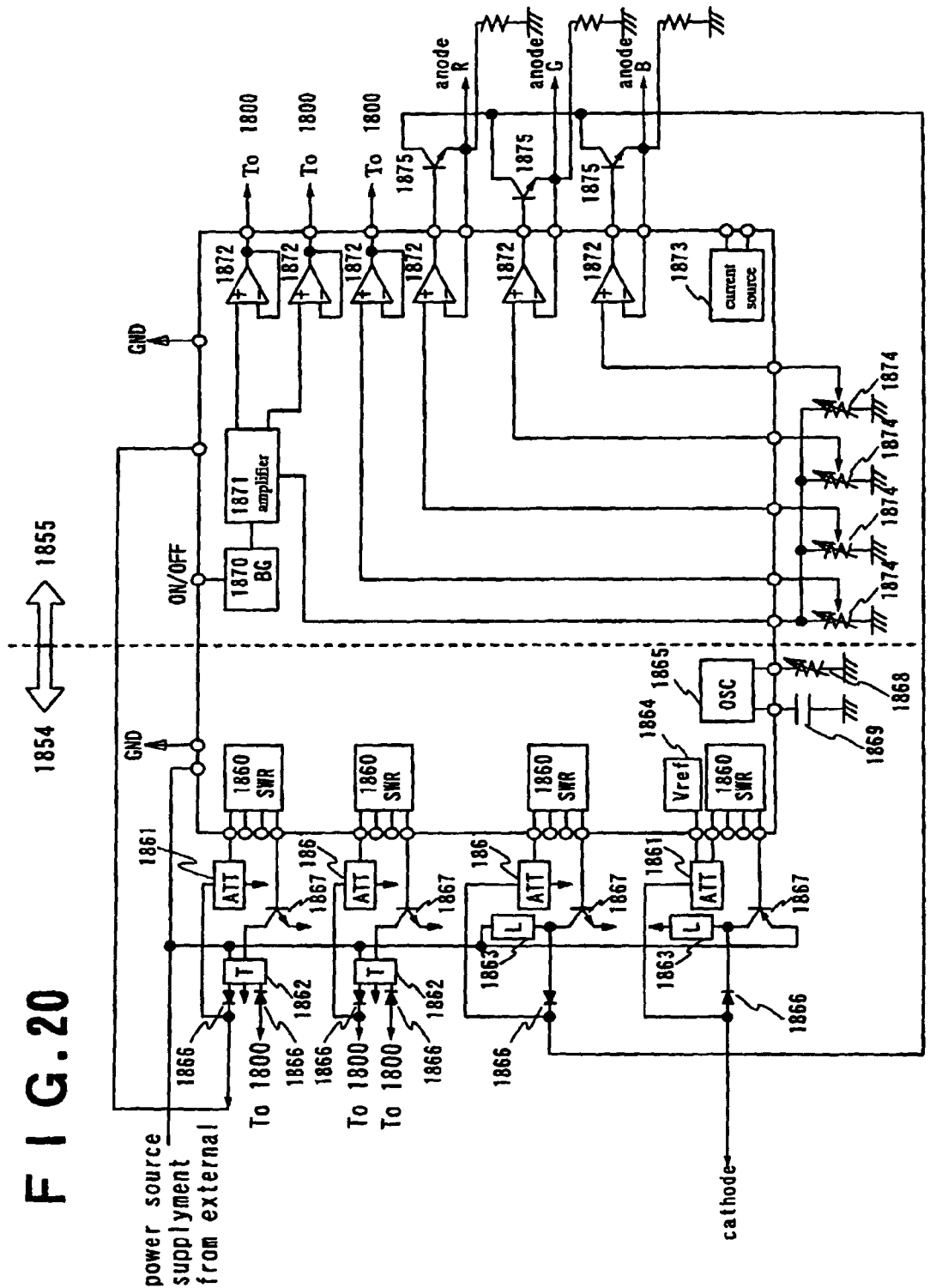
FIG. 20 is a block diagram of a power supply circuit.

Explanation is now made on the configuration of the power supply circuit 1802 with reference to FIG. 20. The power supply circuit 1802 of this embodiment comprises a switching regulator 1854 using four switching regulator controls 1860 and a series regulator 1855.

Generally, the switching regulator that is small in size and light in weight as compared to the series regulator, can raise voltage and invert polarities besides voltage reduction. On the other hand, the series regulator that is used only in voltage reduction, has a well output voltage accuracy as compared to the switching regulator, hardly causing ripples or noises. The power supply circuit 1802 of this embodiment mode uses a combination of the both.

The switching regulator 1854 shown in FIG. 20 has a switching regulator control (SWR) 1860, an attenuator (ATT) 1861, a transformer (T) 1862, an inductor (L) 1863, a reference power supply (Vref) 1864, an oscillator circuit (OSC) 1865, a diode 1866, a bipolar transistor 1867, a varistor 1868 and a capacitance 1869.

When a voltage of an external Li-ion battery (3.6 V) or the like is transformed in the switching regulator 1854, generated are a power supply voltage to be supplied to a cathode and a power supply voltage to be supplied to the switching regulator 1854.

The series regulator 1855 has a band-gap circuit (BG) 1870, an amplifier 1871, operational amplifiers 1872, a current source 1873, a varistor 1874 and a bipolar transistor 1875, and is supplied with a power supply voltage generated at the switching regulator 1854.

In the series regulator 1855, a power supply voltage generated by the switching regulator 1854 is used to generate a direct current power supply voltage to be supplied to a wiring (current supply line) for supplying current to the anodes of various-color of light emitting devices according to a constant voltage generated by the band-gap circuit 1870.

Incidentally, the current source 1873 is used for a drive method to write video signal current to a pixel. In this case, the current generated by the current source 1873 is supplied to the source line driver circuit 1805 in the panel 1800. In the case of a drive method to write the video signal voltage to a pixel, the current source 1873 need not necessarily be provided.

A switching regulator, an OSC, an amplifier and an operation amplifier is formed using TFT.

The structure of this embodiment may be freely combined with any of the structures of Embodiment Mode 1 to 4 and Embodiment 1 to 6.

In accordance with the present invention, substrate rotation is not necessary, and therefore a vapor deposition system capable of handling large surface area substrates can be provided. Further, a vapor deposition system capable of obtaining a uniform film thickness, even if large surface area substrates are used, can be provided.

It is possible to shorten the period to perform vapor deposit by dividing and filling evaporation materials into a plurality of crucibles and performing vapor deposition at the same time in accordance with the present invention. Also, the present invention can make it possible to control vapor deposition without a shutter.

Furthermore, the distance between the substrate and an evaporation source holder can be shortened in accordance with the present invention, and miniaturization of the vapor deposition system can be achieved. The vapor deposition system becomes smaller, and therefore the amount of sublimated evaporation materials that adhere to inner walls or protective shields in deposition chambers is reduced, and the evaporation materials can be effectively utilized.

Further, the present invention can provide a fabricating system in which a plurality of deposition chambers for performing vapor deposition processing are arranged in succession. Throughput of the light-emitting apparatus can be enhanced if parallel processing is performed in the plurality of deposition chambers.

In addition, the present invention can provide a fabricating system that makes it possible to transport containers that encapsulate evaporation materials, film thickness monitors, and the like in the vapor deposition system, from a installed chamber connecting to the vapor deposition system without exposure to the atmosphere. Handling of the evaporation materials is facilitated in accordance with the present invention, and the mixing in of impurities into the evaporation materials can be avoided. Containers sealed by a material manufacturer can be directly installed in the vapor deposition system without exposure to the atmosphere in accordance with this type of fabricating system, and therefore oxygen and moisture can be prevented from adhering to the evaporation materials, and it becomes possible to handle even more highly purified light emitting devices in the future.

What is claimed is:

1. A method of forming a layer, said method comprising:
installing at least first and second containers to an installation chamber, each of the first and second containers containing an organic compound;
vacuum-exhausting the installation chamber;
heating the first and second containers to a temperature T in the installation chamber;
making a first degree of vacuum in the installation chamber and in a deposition chamber;
opening a gate between the installation chamber and the deposition chamber;
carrying the heated first and second containers to an evaporation holder previously heated to the temperature T, wherein the evaporation holder is in the deposition chamber;
closing the gate between the installation chamber and the deposition chamber;
disposing a substrate in the deposition chamber; and
forming a film over the substrate in the deposition chamber by evaporating the organic compound contained in the first and second containers by making a second degree of vacuum in the deposition chamber higher than the first degree of vacuum while independently heating the first and second containers,
wherein evaporation of the organic compound from the first and second containers is controlled by independently adjusting a distance between the first container and the evaporation holder and a distance between the second container and the evaporation holder.

2. A method of forming a layer, said method comprising:
installing at least first and second containers to an installation chamber, each of the first and second containers containing an organic compound;
vacuum-exhausting the installation chamber;
heating the first and second containers to a temperature T in the installation chamber;
making a first degree of vacuum in the installation chamber and in a deposition chamber;
opening a gate between the installation chamber and the deposition chamber;
carrying the heated first and second containers to an evaporation holder previously heated to the temperature T, wherein the evaporation holder is in the deposition chamber;
closing the gate between the installation chamber and the deposition chamber;
disposing a substrate in the deposition chamber; and
forming a film over the substrate in the deposition chamber by evaporating the organic compound contained in the first and second containers by making a second degree of vacuum in the deposition chamber higher than the first degree of vacuum while independently heating the first and second containers,
wherein the evaporation holder is moved in an X-direction at a certain pitch and in a Y-direction at a certain pitch in the step of forming a film over the substrate in the deposition chamber by evaporating the organic compound, and
wherein evaporation of the organic compound from the first and second containers is controlled by independently adjusting a distance between the first container and the evaporation holder and a distance between the second container and the evaporation holder.

3. A method of forming a layer, said method comprising:
installing at least first and second containers to an installation chamber, each of the first and second containers containing an organic compound;
vacuum-exhausting the installation chamber;
heating the first and second containers to a temperature T in the installation chamber;
making a first degree of vacuum in the installation chamber and in a deposition chamber;
opening a gate between the installation chamber and the deposition chamber;
carrying the heated first and second containers to an evaporation holder previously heated to the temperature T, wherein the evaporation holder is in the deposition chamber;

closing the gate between the installation chamber and the deposition chamber;

disposing a substrate in the deposition chamber; and forming a film over the substrate in the deposition chamber by evaporating the organic compound contained in the first and second containers by making a second degree of vacuum in the deposition chamber higher than the first degree of vacuum while independently heating the first and second containers, wherein the evaporation holder is rotated in the step of forming a film over the substrate in the deposition chamber by evaporating the organic compound, and wherein evaporation of the organic compound from the first and second containers is controlled by independently adjusting a distance between the first container and the evaporation holder and a distance between the second container and the evaporation holder.

4. The method according to claim 1, wherein the first and second containers comprise at least one of a heat-resisting metal, a sintered boron nitride, a sintered compound of boron nitride and aluminum nitride, a quartz and a graphite.

5. The method according to claim 1, wherein the evaporation holder includes a tilt regulating screw.

6. The method according to claim 2, wherein the first and second containers comprise at least one of a heat-resisting metal, a sintered boron nitride, a sintered compound of boron nitride and aluminum nitride, a quartz and a graphite.

7. The method according to claim 2, wherein the evaporation holder includes a tilt regulating screw.

8. The method according to claim 3, wherein the first and second containers comprise at least one of a heat-resisting metal, a sintered boron nitride, a sintered compound of boron nitride and aluminum nitride, a quartz and a graphite.

9. The method according to claim 3, wherein the evaporation holder includes a tilt regulating screw.

10. The method according to claim 1, wherein the organic compound contained in the first and second containers is the same.

11. The method according to claim 1, wherein the organic compound contained in the first and second containers is different.

12. The method according to claim 2, wherein the organic compound contained in the first and second containers is the same.

13. The method according to claim 2, wherein the organic compound contained in the first and second containers is different.

14. The method according to claim 3, wherein the organic compound contained in the first and second containers is the same.

15. The method according to claim 3, wherein the organic compound contained in the first and second containers is different.

16. The method according to claim 1, wherein the film is formed over the substrate in the deposition chamber by evaporating the organic compound contained in the first and second containers by making the second degree of vacuum in the deposition chamber higher than the first degree of vacuum while maintaining the first and second containers at the temperature T.

17. The method according to claim 2, wherein the film is formed over the substrate in the deposition chamber by evaporating the organic compound contained in the first and second containers by making the second degree of vacuum in the deposition chamber higher than the first degree of vacuum while maintaining the first and second containers at the temperature T.

18. The method according to claim 3, wherein the film is formed over the substrate in the deposition chamber by evaporating the organic compound contained in the first and second containers by making the second degree of vacuum in the deposition chamber higher than the first degree of vacuum while maintaining the first and second containers at the temperature T.

* * * * *